(12) United States Patent
Rinne et al.

(10) Patent No.: US 11,916,033 B2
(45) Date of Patent: Feb. 27, 2024

(54) METHOD AND SYSTEM FOR PACKING OPTIMIZATION OF SEMICONDUCTOR DEVICES

(71) Applicant: AMKOR TECHNOLOGY SINGAPORE HOLDING PTE.LTD., Singapore (SG)

(72) Inventors: Glenn Rinne, Apex, NC (US); Daniel Richter, Goldsboro, NC (US)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 0 days.

(21) Appl. No.: 17/588,525

(22) Filed: Jan. 31, 2022

(65) Prior Publication Data
US 2022/0157755 A1    May 19, 2022

Related U.S. Application Data

(63) Continuation of application No. 16/943,015, filed on Jul. 30, 2020, now Pat. No. 11,239,192, which is a
(Continued)

(51) Int. Cl.
*H01L 23/00* (2006.01)
*H01L 23/498* (2006.01)

(52) U.S. Cl.
CPC ........ *H01L 24/14* (2013.01); *H01L 23/49838* (2013.01); *H01L 24/06* (2013.01); *H01L 24/11* (2013.01); *H01L 24/13* (2013.01); *H01L 23/49816* (2013.01); *H01L 24/81* (2013.01); *H01L 2224/06051* (2013.01); *H01L 2224/06177* (2013.01); *H01L 2224/119* (2013.01); *H01L 2224/11849* (2013.01); *H01L 2224/131* (2013.01); *H01L 2224/13012* (2013.01); *H01L 2224/13014* (2013.01); *H01L 2224/13015* (2013.01); *H01L 2224/13016* (2013.01);
(Continued)

(58) Field of Classification Search
CPC ......... H01L 24/14; H01L 24/06; H01L 24/11; H01L 24/13; H01L 24/81; H01L 23/49838; H01L 23/49816
See application file for complete search history.

(56) References Cited

U.S. PATENT DOCUMENTS

| 6,664,620 | B2 | 12/2003 | Siu et al. |
| 6,793,500 | B1 | 9/2004 | Budell et al. |

(Continued)

FOREIGN PATENT DOCUMENTS

| CN | 103000597 | 3/2013 |
| TW | 201017852 | 5/2010 |

(Continued)

OTHER PUBLICATIONS

Taiwanese Official Letter for 105131900, dated Dec. 15, 2019, 24 pages.
(Continued)

*Primary Examiner* — Christine A Enad
(74) *Attorney, Agent, or Firm* — McAndrews, Held & Malloy, Ltd.

(57) ABSTRACT

Provided is a disclosure for optimizing the number of semiconductor devices on a wafer/substrate. The optimization comprises laying out, cutting, and packaging the devices efficiently.

19 Claims, 23 Drawing Sheets

Related U.S. Application Data continuation of application No. 15/968,360, filed on May 1, 2018, now Pat. No. 10,734,343, which is a continuation of application No. 15/233,271, filed on Aug. 10, 2016, now abandoned.

(52) U.S. Cl.
CPC ............ *H01L 2224/13017* (2013.01); *H01L 2224/14051* (2013.01); *H01L 2224/14131* (2013.01); *H01L 2224/14133* (2013.01); *H01L 2224/14135* (2013.01); *H01L 2224/14141* (2013.01); *H01L 2224/14151* (2013.01); *H01L 2224/14153* (2013.01); *H01L 2224/14154* (2013.01); *H01L 2224/14177* (2013.01); *H01L 2224/81815* (2013.01); *H01L 2924/10156* (2013.01); *H01L 2924/15311* (2013.01)

(56) References Cited

U.S. PATENT DOCUMENTS

| | | | |
|---|---|---|---|
| 8,178,392 B2 | 5/2012 | Choi et al. | |
| 2008/0185735 A1* | 8/2008 | Pham | H01L 23/49838 257/E21.511 |
| 2008/0283998 A1* | 11/2008 | Choi | H01L 23/49838 257/E23.141 |
| 2011/0057332 A1 | 3/2011 | Iwami | |
| 2011/0074047 A1 | 3/2011 | Pendse | |
| 2012/0098120 A1 | 4/2012 | Yu et al. | |
| 2012/0199966 A1 | 8/2012 | Kuo et al. | |
| 2013/0062741 A1* | 3/2013 | Wu | H01L 23/49838 257/E21.705 |
| 2013/0062755 A1 | 3/2013 | Kuo et al. | |
| 2013/0323526 A1 | 12/2013 | Hasin et al. | |
| 2013/0335939 A1 | 12/2013 | Aleksov et al. | |
| 2014/0035148 A1 | 2/2014 | Chuang et al. | |
| 2014/0048929 A1 | 2/2014 | Cha et al. | |
| 2015/0049441 A1 | 2/2015 | Hu et al. | |
| 2015/0364404 A1 | 12/2015 | Chen et al. | |
| 2016/0013144 A1 | 1/2016 | Chen | |
| 2016/0086905 A1 | 3/2016 | Aleksov et al. | |
| 2016/0181213 A1 | 6/2016 | Lee et al. | |
| 2016/0243833 A1 | 8/2016 | Shibata | |
| 2017/0125389 A1 | 5/2017 | Kulick et al. | |
| 2017/0271291 A1* | 9/2017 | Cha | H01L 23/49838 |

FOREIGN PATENT DOCUMENTS

| | | |
|---|---|---|
| TW | 201214563 | 4/2012 |
| TW | 201418870 | 5/2014 |
| TW | 201535658 | 9/2015 |
| TW | 201545274 | 12/2015 |
| TW | 201601193 | 1/2016 |
| TW | 201611107 | 3/2016 |

OTHER PUBLICATIONS

Taiwanese Official Letter for 111112292, completed May 19, 2022, 9 pages.
Chinese Official Letter for 201611010456.1, dated May 17, 2023, 21 pages. English translation included.

* cited by examiner

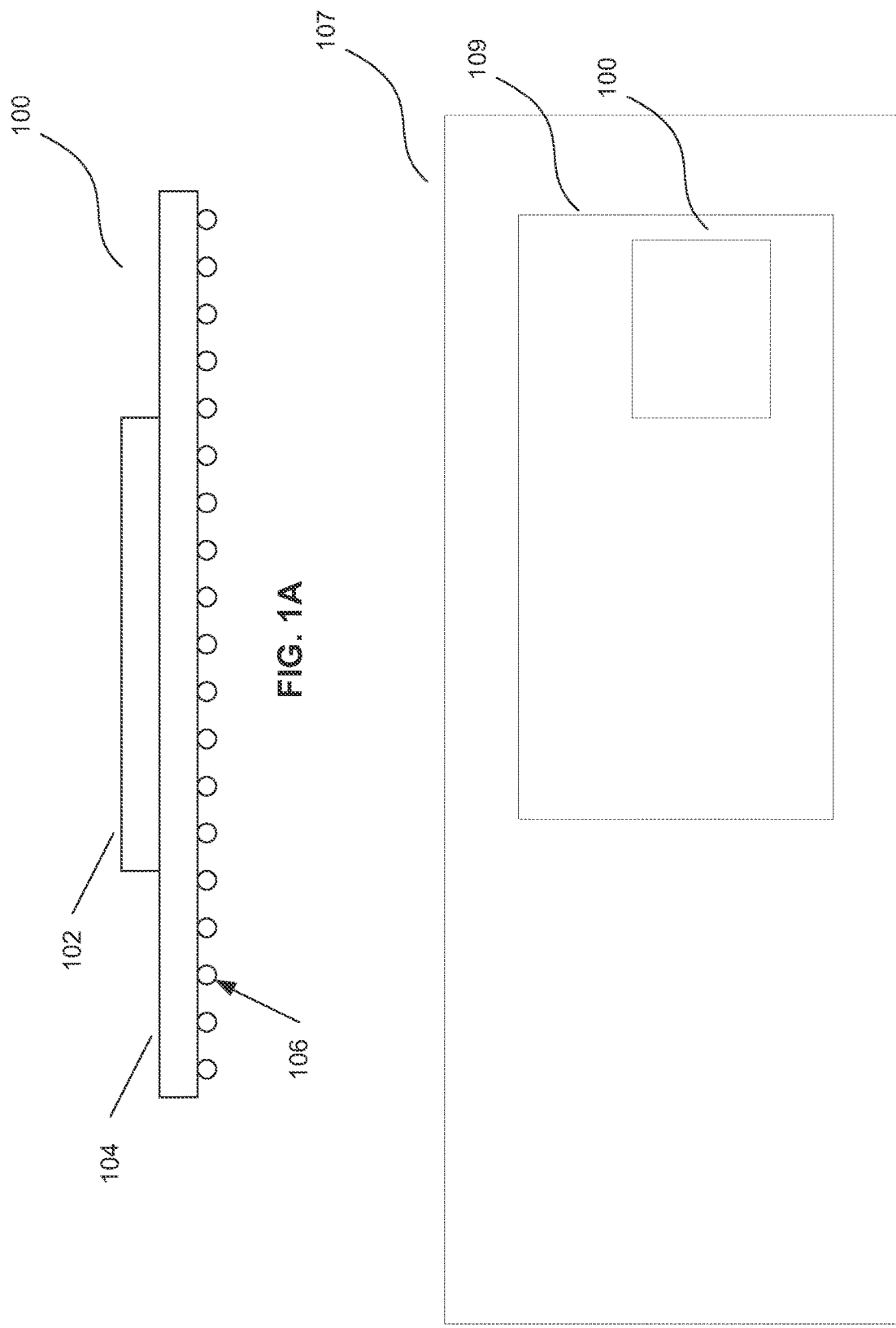

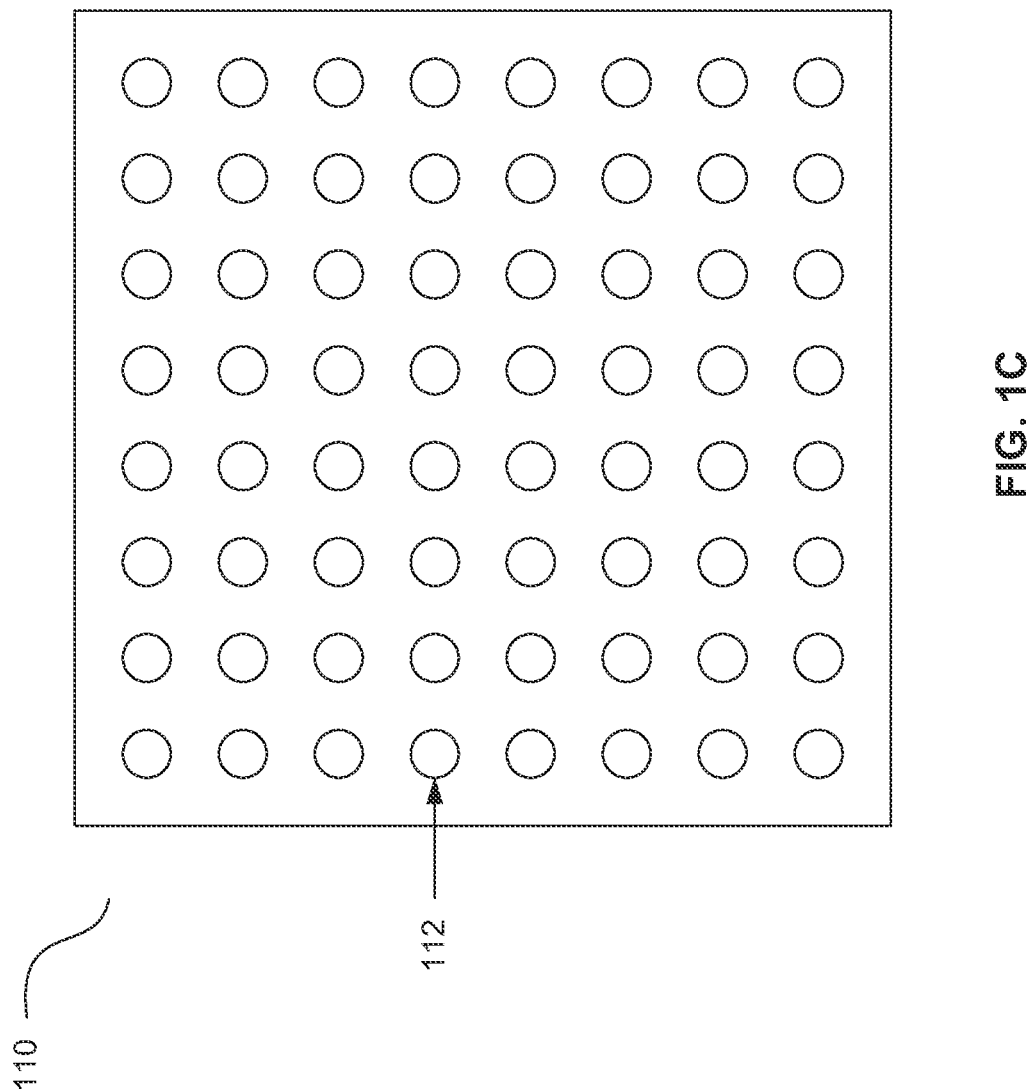

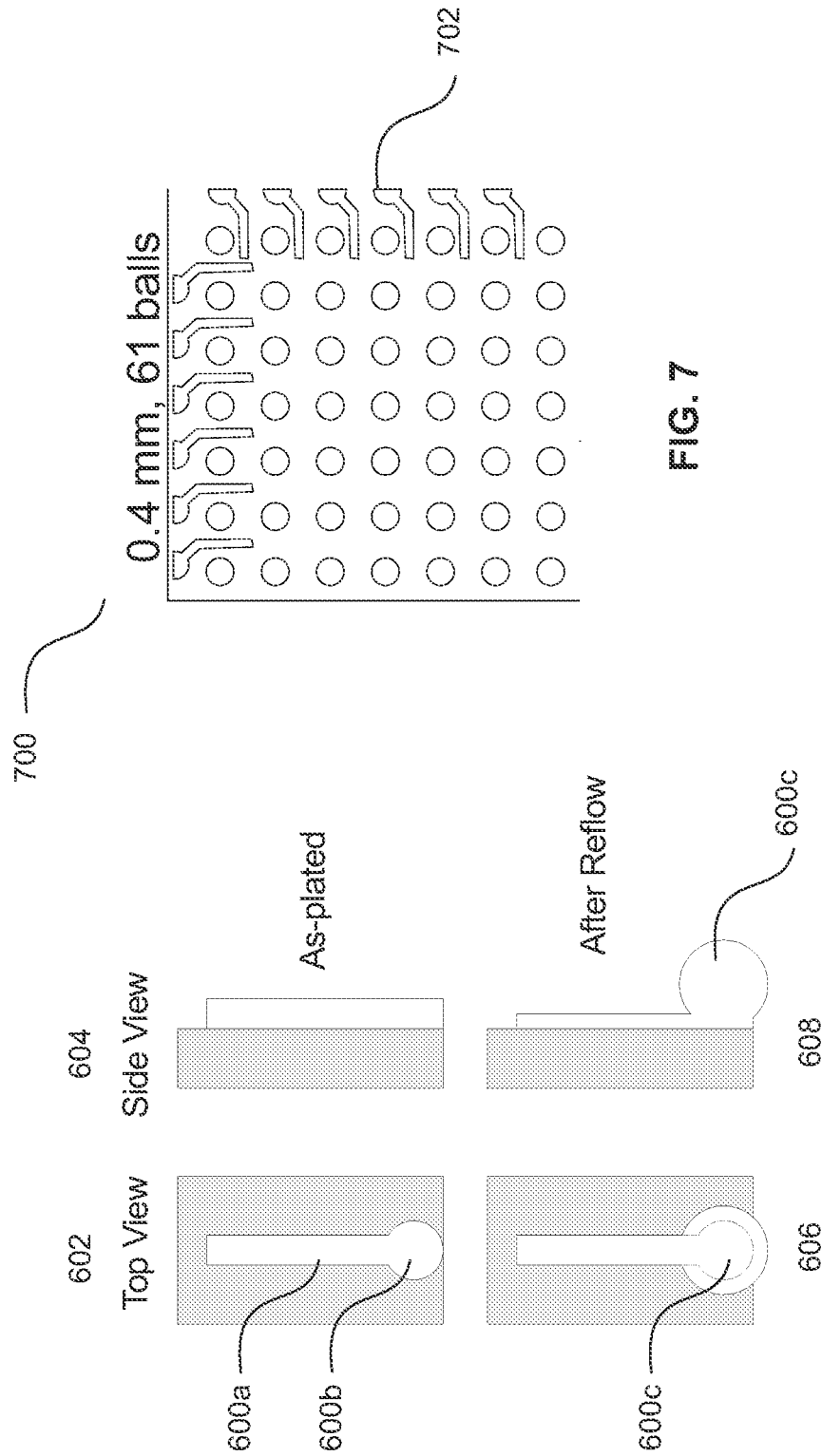

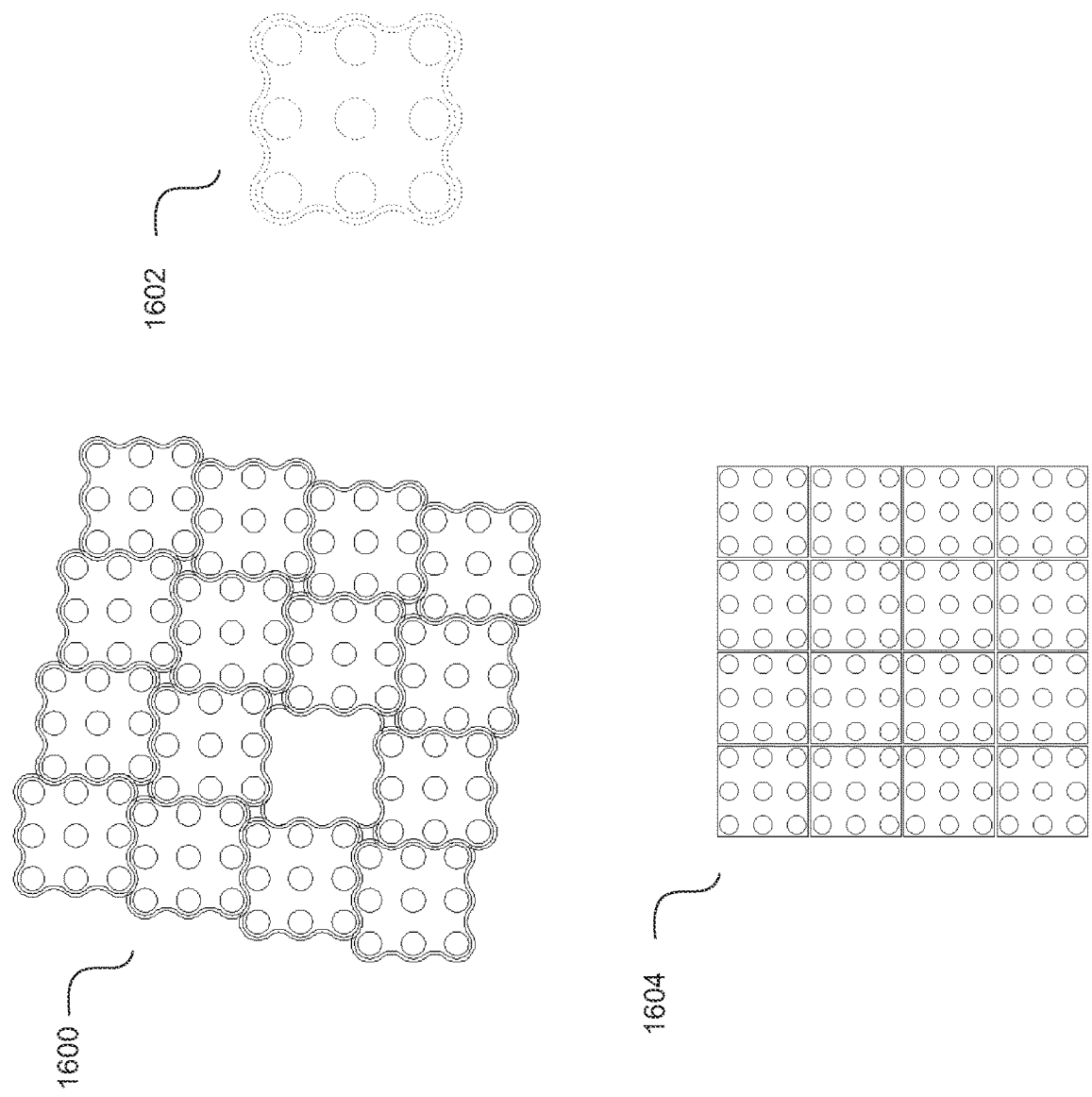

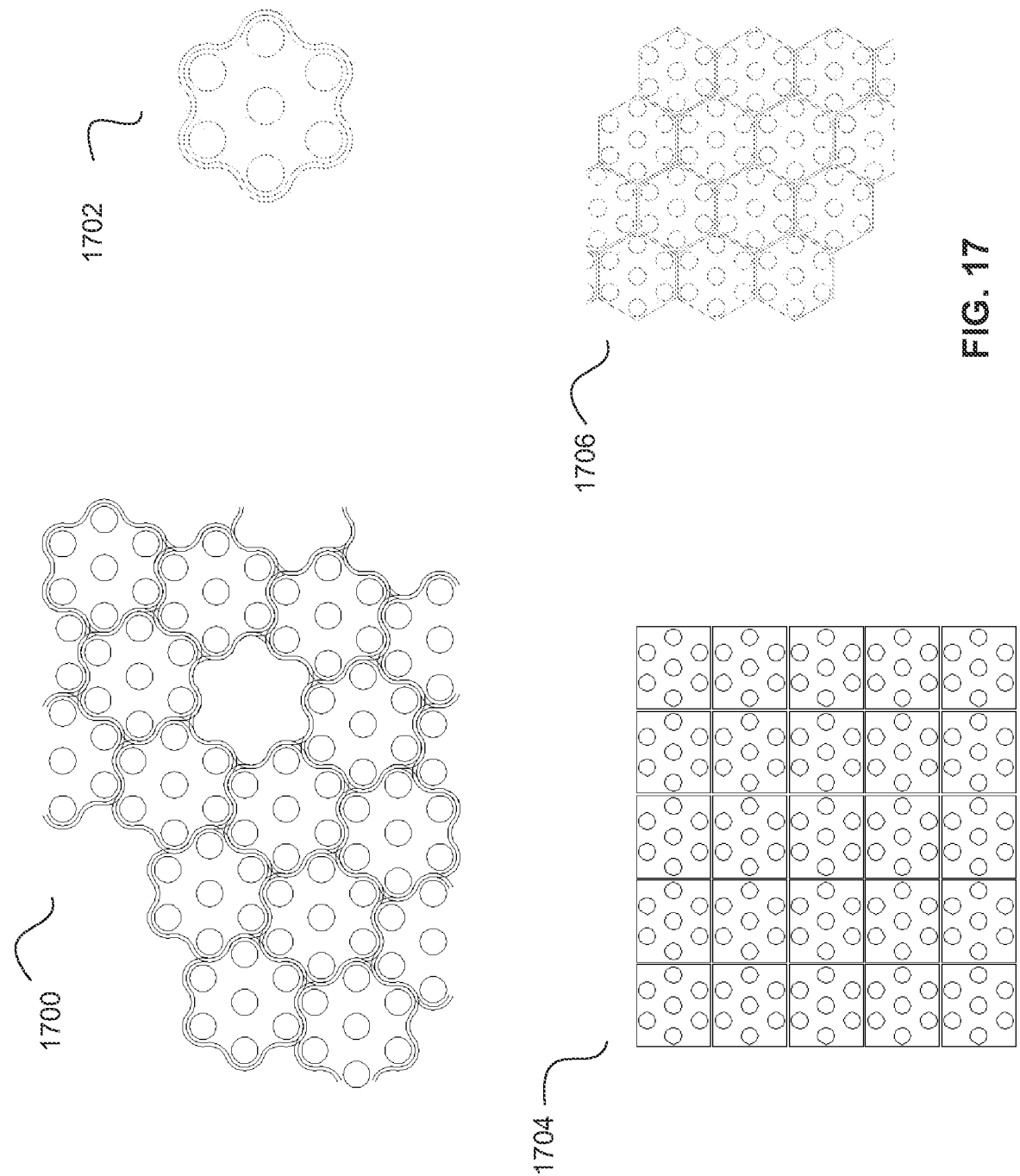

METHOD AND SYSTEM FOR PACKING OPTIMIZATION OF SEMICONDUCTOR DEVICES

The following document is incorporated by reference into this disclosure as if fully set forth herein: U.S. Pat. No. 7,659,621 titled "Solder Structures for Out of Plane Connections" and filed on Feb. 27, 2006.

TECHNICAL FIELD

The present disclosure relates to semiconductor devices, and more particularly, to a method and system for packing optimization of semiconductor devices.

BACKGROUND

The electronics industry is using more integrated circuits (ICs) in various devices, including mobile devices such as smartphones. In order to provide ever increasing functionality for these smaller devices, smaller semiconductor components are required. One way to get smaller ICs is to miniaturize the transistor and circuit layout on dies. Another way to miniaturize is to keep the packaged IC as small as possible while still providing the interconnects needed for the IC to communicate with other components on a printed circuit (PC) board.

An interconnect can be thought of as a general term for an electrical contact for a semiconductor, and solder balls, solder bumps (with or without metallic pillars), pads, etc. may be specific types of electrical contact.

Further limitations and disadvantages of conventional and traditional approaches will become apparent to one of skill in the art, through comparison of such systems with some aspects of the present disclosure as set forth in the remainder of the present application with reference to the drawings.

SUMMARY

A method and system for packing optimization for semiconductor dies, substantially as shown in and/or described in connection with at least one of the figures, and as set forth more completely in the claims.

Various advantages, aspects, and novel features of the present disclosure, as well as details of an illustrated embodiment(s) thereof, will be more fully understood from the following description and drawings.

BRIEF DESCRIPTION OF THE DRAWINGS

These and/or other aspects will become apparent and more readily appreciated from the following description of the various example embodiments, taken in conjunction with the accompanying drawings.

FIG. 1A is a figure illustrating a die on package.

FIG. 1B is a figure illustrating use of a packaged die in an electronic device.

FIG. 1C is a figure illustrating a die with square grid packing for interconnects.

FIG. 6 illustrates an example of a interconnect at the edge of a die after reflow that can be used with an embodiment of the disclosure.

FIG. 7 illustrates an example of interconnects at the edges of a die that can be used with an embodiment of the disclosure.

FIG. 16 is an illustration of an example of a 9-interconnect square die in accordance with an embodiment of the disclosure.

FIG. 17 is an illustration of an example of a 7-interconnect hex die in accordance with an embodiment of the disclosure.

DETAILED DESCRIPTION

Figure 1D:
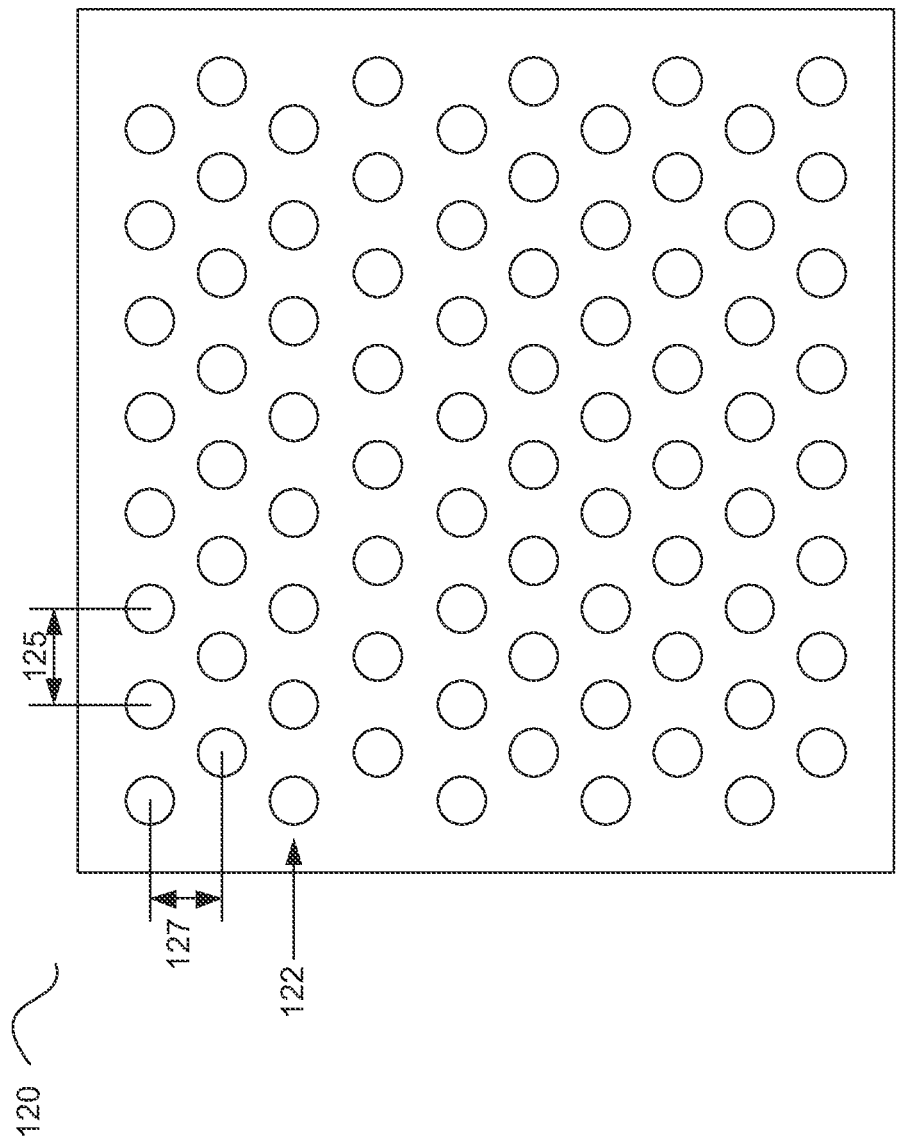
FIG. 1D is a figure illustrating a die with staggered hexagonal packing for interconnects.

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or." As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

All terms including descriptive or technical terms used herein should be construed as having meanings that are obvious to one of ordinary skill in the art. When a term has an ambiguous meaning due to evolving of language, precedent cases, or the appearance of new technologies, the meaning of a term used in this disclosure should first be clarified by its usage and/or definition in this disclosure. The term should then be clarified as one of ordinary skill in the art would have understood the term at the time of this disclosure.

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component, or a first section discussed below could be termed a second element, a second component, or a second section without departing from the teachings of the present disclosure. Similarly, various spatial terms, such as "upper," "above," "lower," "below," "side," "lateral," "horizontal," "vertical," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

It will also be understood that terms coupled, connected, attached, and the like include both direct and indirect (e.g., with an intervening element) coupling, connecting, attaching, etc., unless explicitly indicated otherwise. For example, if element A is coupled to element B, element A may be indirectly coupled to element B through an intermediate signal distribution structure, element A may be directly coupled to element B (e.g., adhered directly to, soldered directly to, attached by direct metal-to-metal bond, etc.), etc.

In the drawings, the dimensions of structures, layers, regions, etc. (e.g., absolute and/or relative dimensions) may be exaggerated for clarity. While such dimensions are generally indicative of an example implementation, they are not limiting. For example, if structure A is illustrated as being larger than region B, this is generally indicative of an example implementation, but structure A is generally not required to be larger than structure B, unless otherwise indicated. Additionally, in the drawings, like reference numerals may refer to like elements throughout the discussion.

Software component may refer to executable code and/or data used by the executable code in an addressable storage medium. Thus, software components may be, for example, object-oriented software components, class components, and task components, and may include processes, functions, attributes, procedures, subroutines, segments of program code, drivers, firmware, micro codes, circuits, data, a database, data structures, tables, arrays, or variables.

The term "unit" in the embodiments of the present disclosure means a software component or a hardware component that performs a specific function. A function provided by a "unit" may be divided into additional components and "units."

Reference will now be made in detail to embodiments, examples of which are illustrated in the accompanying drawings. In this regard, the present embodiments may have different forms and should not be construed as being limited to the descriptions set forth herein.

In the descriptions below, for ease of explanation, there will be reference, for example, to a pitch of 0.4 mm between the centers of two adjacent interconnects (e.g., bumps, balls, posts, pillars, pads, any of a variety of types of interconnection structures, etc.). This may be referred to as an example pitch for the purposes of this disclosure. The disclosure will also refer to, for example, circular interconnects with 0.25 mm diameter that may be reference to as standard circular interconnects, and, hence, there may be a space of 0.15 mm between edges of adjacent interconnects (e.g., bumps). However, it should be understood that these dimensions, as well as other dimensions in the disclosure, can change with different designs and/or technology. Accordingly, the any stated dimensions in the disclosure should not be seen as limiting any embodiment of the disclosure in any way.

A substrate as used in this disclosure is a general term that can refer to, for example, the body of a semiconductor die, or to a base or material on which a die is placed and to which the die is connected, such as an interposer, a laminate substrate, and/or coreless substrate, among others. Accordingly, while various embodiments of the disclosure may be described with respect to a die for ease of description, it should be realized that the scope of such embodiments of the disclosure is not limited to a die, but can also extend to a substrate generally.

An aspect of the disclosure may be a semiconductor die that includes interconnects, where the interconnects have edge interconnects along the edges of the semiconductor die, and at least one of the edges is non-linear. Another aspect of the disclosure may be a semiconductor die that includes a plurality of interconnects, where the plurality of interconnects are non-circular interconnects, each with a major axis and a minor axis. Still another aspect of the disclosure may be a semiconductor die that has a first row of interconnects offset horizontally with respect to a second row of interconnects adjacent to the first row of interconnects, where adjacent interconnects of the first row of interconnects and adjacent interconnects of the second rows of interconnects have a first pitch, and the first pitch is different than a vertical distance from a line through centers of the first row of interconnects to a line through centers of the second row of interconnects.

In the following description, well-known functions or constructions are not described in detail so as not to obscure the embodiments with unnecessary detail.

FIG. 1A is a figure illustrating a die on package. Referring to FIG. 1, there is shown an integrated circuit (IC) 100 comprising the die 102 and the package substrate 104. Among other things, the package substrate 104 provides interconnection structure for electrically connecting the circuitry on the die 102 to external circuitry (not shown) that may be other ICs and/or printed circuit boards (PCBs). The interconnection structures as shown in FIG. 1 are bumps 106, which may comprise solder bumps and/or metallic pillar structures. However, the interconnection structure may also be, for example, solder balls, metal pads, as well as any other suitable structures. The package substrate 104 may be much larger than the die 102 because of the need for more bumps 106 than can fit on a surface of the die 102.

The increased package size takes up valuable real estate on a printed circuit board (PCB), especially when a device using the die 102 requires miniaturization. Smaller pitch can be used to increase the density of interconnects on a die, but there is a limit due to assembly equipment tolerances and substrate technology. This limit may be able to be overcome with new equipment, but that may be additional expense that the assemblers cannot withstand.

Some additional gains can be made by using schemes where the die 102 is made a little larger than necessary to hold the functional circuitry so that more bumps 106 can be put on the die 102. However, while this may make the packaged IC 100 a little smaller than if the bumps 106 were put on the package substrate 104, this leads to fewer dies per each semiconductor wafer.

FIG. 1B is a figure illustrating use of a packaged die in an electronic device. Referring to FIG. 1B, there is shown the electronic device 107 that may be, for example, a smart phone, an MP3 player, a digital camera, etc. The electronic device 107 comprises a printed circuit board 109 with the IC 100. The IC 100 may be, for example, a microprocessor, memory, input/output interface for communicating with external devices (not shown), etc. In some cases, the IC 100 may comprise these and/or other functionalities as a system on chip, and may include executable code on a non-volatile portion of the IC 100.

FIG. 1C is a figure illustrating a die with square grid packing for interconnects. Referring to FIG. 1C, there is shown an example of a package 110 with interconnects 112 laid out in a grid with a pitch of 0.4 mm. In many cases, the package may be much larger than the substrate because of the need for the interconnection structure for input and output signals to and from the substrate.

FIG. 1D is a figure illustrating a die with staggered hexagonal packing for interconnects. Referring to FIG. 1D, there is shown a package 120 with hexagonal packing configuration for the interconnects 122. Because the interconnects are offset horizontally from row to row, they can have, for example, a horizontal pitch 125 of, for example, 0.4 mm, but the vertical distance 127 from the center of one row to the center of the next row can be closer together than the horizontal pitch 125 or the rows in the grid of FIG. 1C while maintaining the same minimum spacing between interconnects, thereby allowing more rows to fit in the same vertical distance. Accordingly, for this example, the interconnect density may increase from 589 interconnects/cm$^2$ for the square grid configuration to 693 interconnects/cm$^2$ for the hexagonal packing configuration, resulting in an interconnect density increase of over 17%. It may be seen that switching from a square array to a hexagonal array will result in more interconnects per package.

Figure 2:
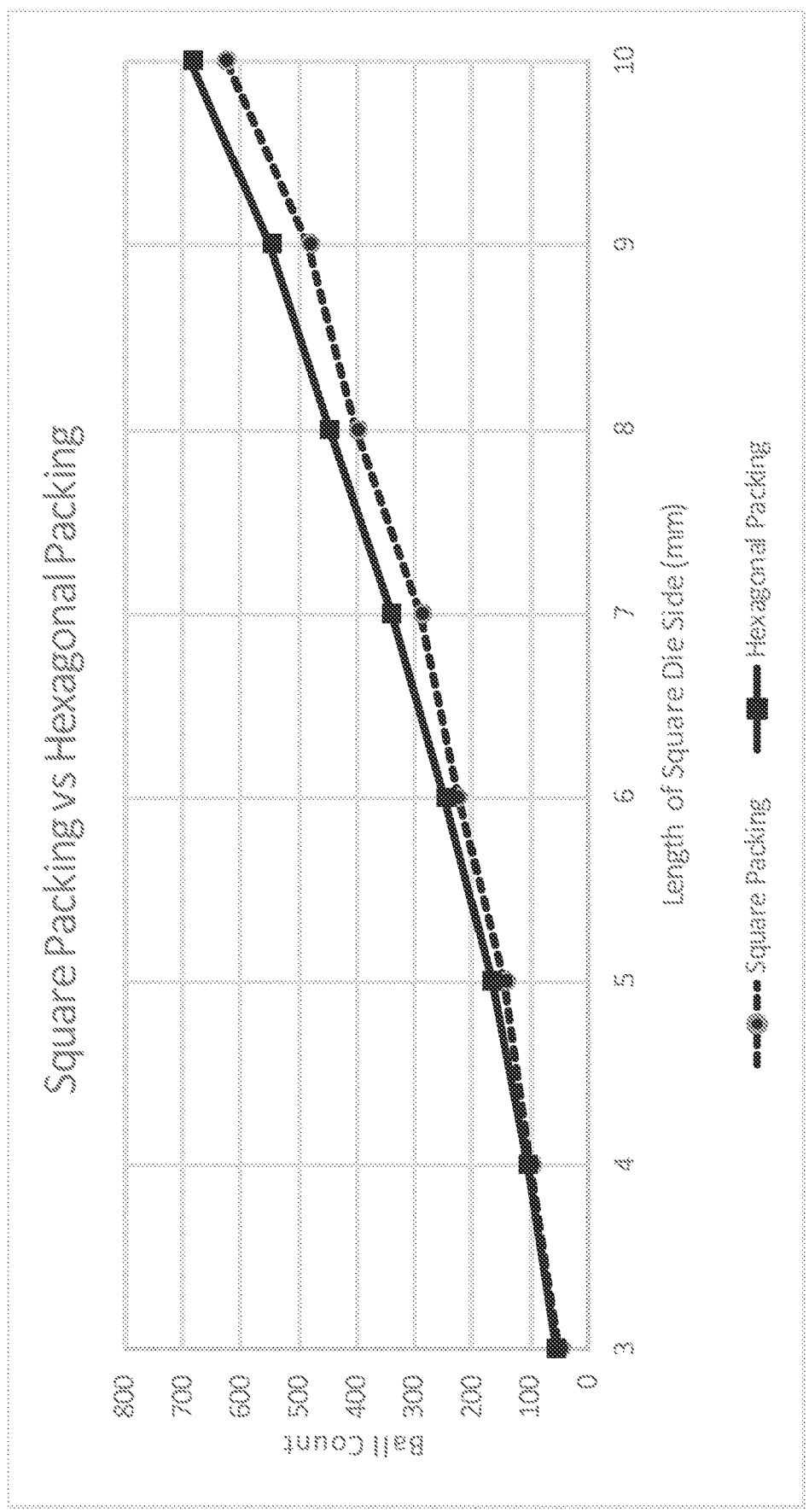
FIG. 2 is a graph comparing packing method of square grid packing and staggered hexagonal packing.

FIG. 2 is a graph comparing packing method of square grid packing and staggered hexagonal packing. Referring to FIG. 2, there is shown a graph that shows the number of interconnects versus die size. As can be seen, the number of interconnects is consistently higher for the hexagonal packing configuration than for the square grid packing configuration for the same die size, with the die size ranging in length from 3 mm to 10 mm. The trend of the graph also shows that as the die size increases, the hexagonal packing configuration continues to be able to provide more interconnects for the same die size than the square grid configuration.

Figure 3:
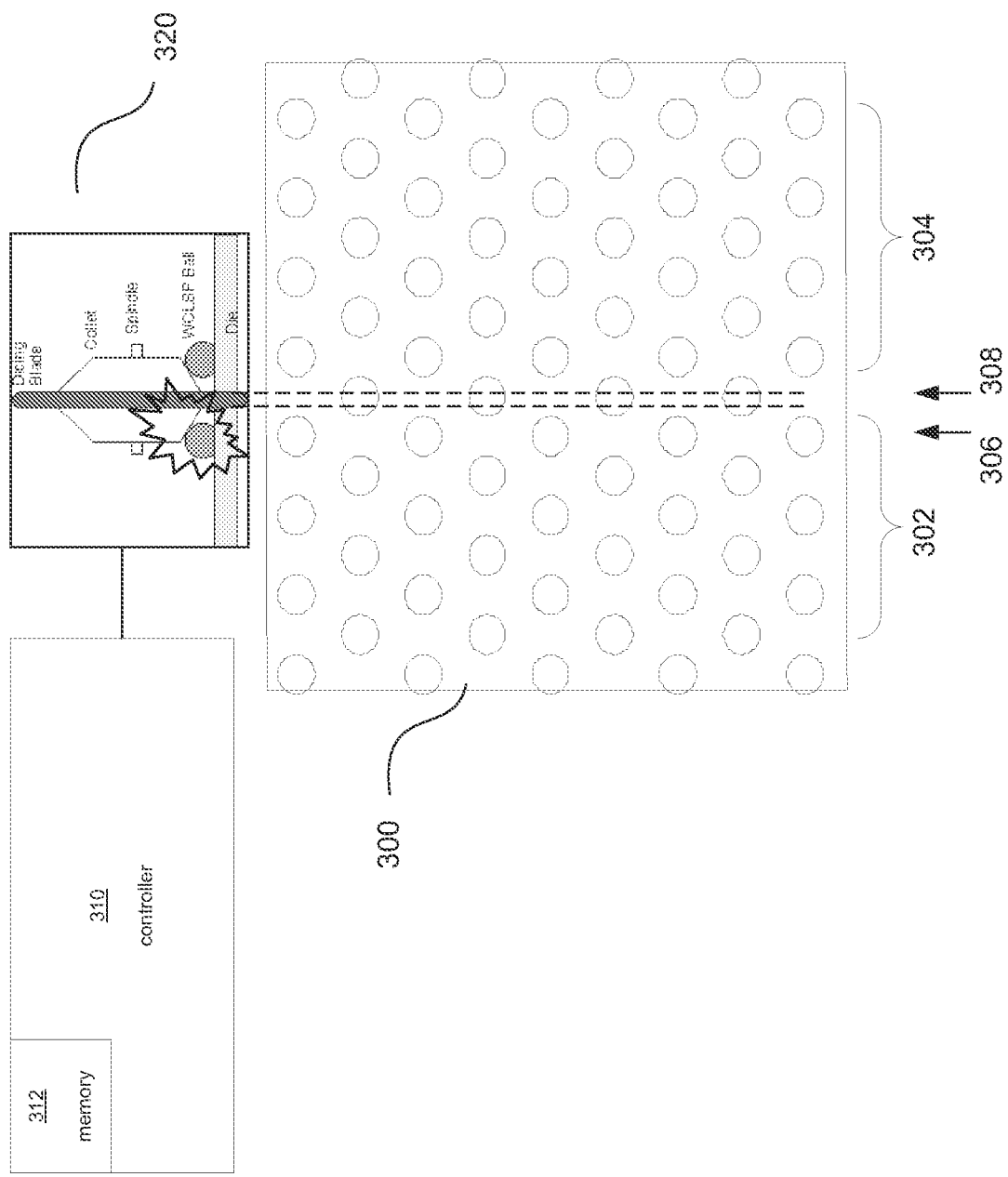
FIG. 3 is a figure illustrating an effect on interconnects at the edges of a die by sawing a die that may be used with embodiment(s) of the disclosure.

FIG. 3 is a figure illustrating an effect on interconnects at the edges of a die by sawing a die that may be used with an embodiment of the disclosure. Referring to FIG. 3, there is shown a wafer 300 comprising a plurality of dies, including the dies 302 and 304, a saw controller 310, and the dicing saw 320. To be able to use the dies, the dies 302 and 304, among others not shown, need to be cut free (or diced or excised or singulated) from the wafer 300. When a straight cut is made to separate the die 302 from the die 304, some interconnects may also be cut in part, thereby typically ruining them from use as electrical connections.

It can be seen that the interconnects in column 308 are cut by the dicing saw 320 so that they cannot be used. Additionally, while the interconnects in column 306 may appear to be whole, there may be structural damage to the interconnects due to mechanical stress, chipping, etc., because the cutting instrument, for example, the dicing saw 320, may have come too close to the interconnects in the column 306. For example, the collett of the dicing saw 320 may hit the interconnects and cause damage to the interconnects.

When using a dicing saw, for example, the interconnects may generally be 25 µm or more from the seal ring, and the seal ring may generally be 40 µm from the center of the cutting blade. Accordingly, there generally may be 65 µm of buffer on each side of the cutting blade to usable interconnects. While interconnects may be formed on the seal ring, the interconnects may still be damaged during dicing.

The dicing saw 320 may be controlled, for example, by the saw controller 310. The saw controller 310 may execute instructions stored in the memory 312, where the memory 312 may comprise volatile and non-volatile memory, and may also comprise other types of storage including, for example, hard disk drive(s).

Figure 4:
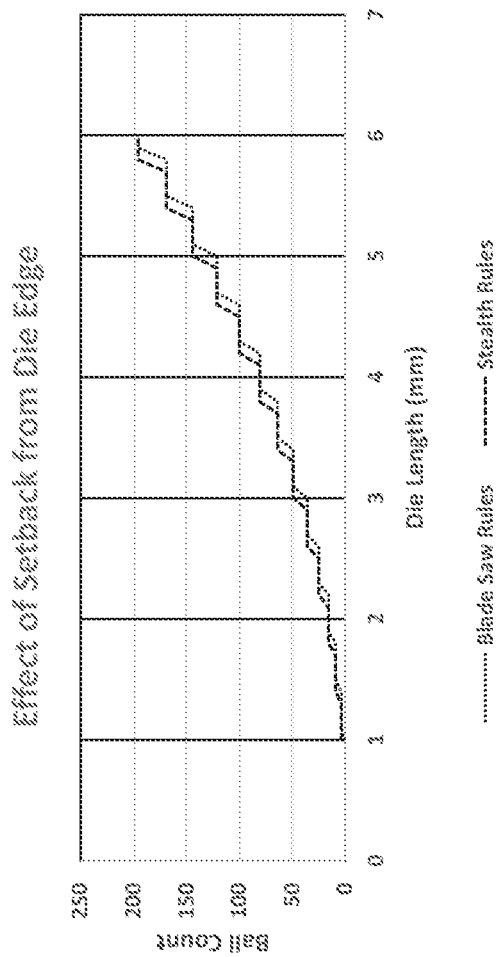
FIG. 4 is a graph illustrating an effect of sawing a die that may be used with an embodiment of the disclosure.

FIG. 4 is a graph illustrating an effect of sawing a die that may be used with an embodiment of the disclosure. Referring to FIG. 4, there is shown a graph of interconnects per a given size die using typical setback rules for separating dies versus an embodiment of the disclosure whereby the dies are separated using optimized setback rules. The setback rules may be optimized for specific implementations of the die and wafer, as well as the technology that is used for dicing. As can be seen, there are cases where the number of interconnects are higher when the optimized setback rule cuts are used than when normal setback rule cuts are used, and there are cases when the number of interconnects are the same for both the optimized setback rule cuts and for normal straight cuts.

Figure 5A:
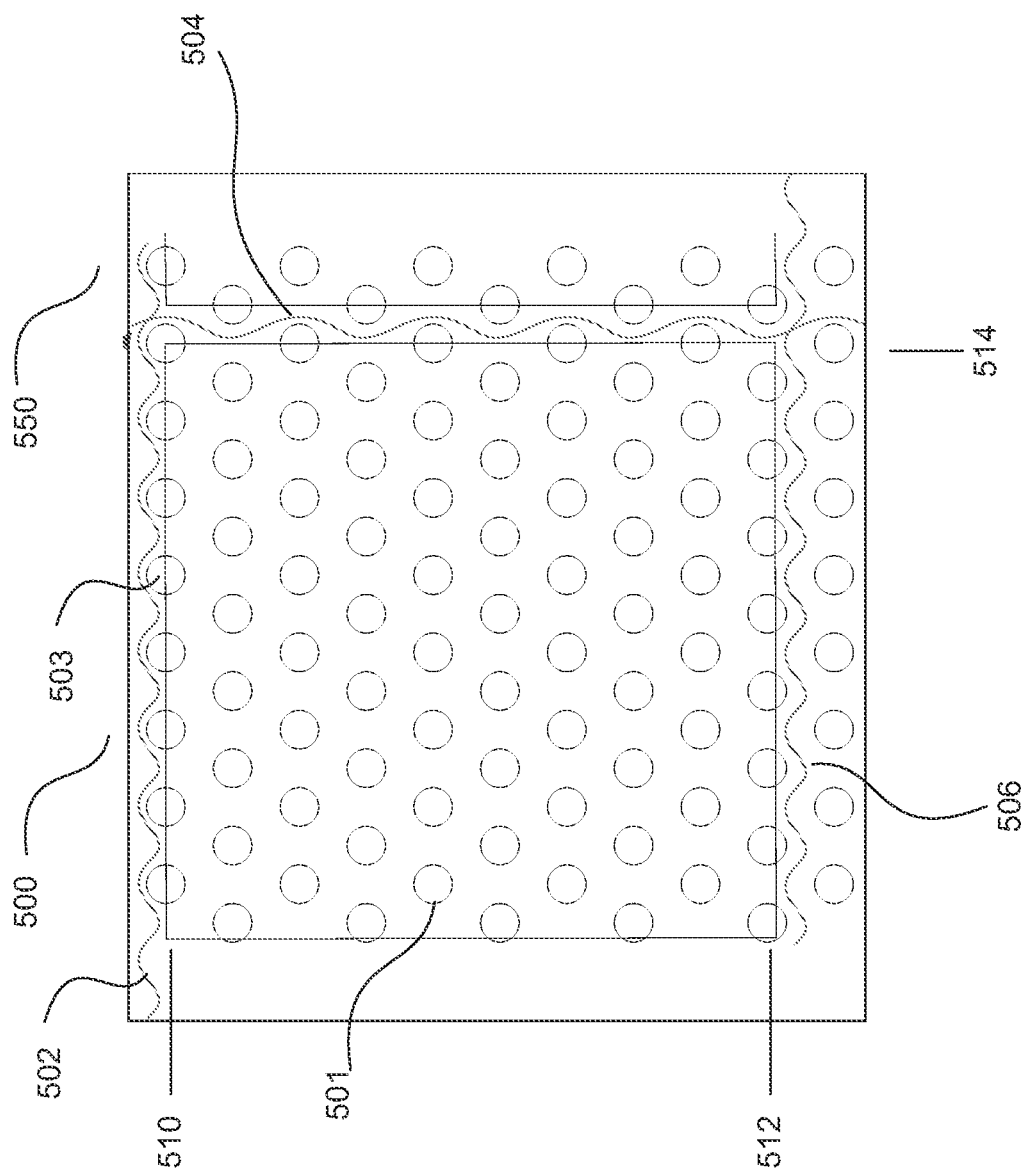
FIG. 5A illustrates an example of a serpentine kerf when dicing a die in accordance with an embodiment of the disclosure.

FIG. 5A illustrates serpentine kerf when dicing a die in accordance with an embodiment of the disclosure. Referring to FIG. 5A, there are shown adjacent dies 500 and 550 with interconnects 501, where some of the interconnects 501 are along the rows 510 and 512, as well as along the column 514. The rows 510, 512, and column 514 may have interconnects 501 formed on a seal ring. When using a dicing blade for a straight cut, the interconnects 501 on the seal ring may be set back by as much as 65 μm on each side of a dicing blade, with possible damage to the interconnects 501 on the seal ring. However, by using non-linear cuts (non-linear kerfs or serpentine cuts) for the edges 502, 504, and 506, all of the interconnects 501 on the rows 510 and 512, as well as those on column 514 may be kept whole, and therefore usable for electrical signals to and from the dies 500. The interconnects 501 on the rows 510, 512, and column 514, at the edges of a die, may be referred to as edge interconnects 503, or edge bumps. Accordingly, the boundary (kerf) between the die 500 and the die 550 may, for example, not be straight but go around the edge interconnects 503 at the edges of the dies 500 and 550. Therefore, the edge interconnects 501 of the dies 500 and 550 may be laid out so that the edge interconnects 503 of the dies 500 and 550 may fit in with each other.

The serpentine cuts (non-linear cuts/kerfs) for the edges 502, 504, and 506 may be made with a suitable tool such as, for example, a plasma dicing tool that may typically need 10 μm on each side of the center of the cutting lane. Accordingly, the extra 55 μm with respect to the dicing blade on each side may allow an additional row and/or column even if straight cuts are made. Combining the narrower cutting lanes with serpentine cuts may allow for additional row/column of interconnects 501. Note, however, that the scope of the present disclosure is not limited by the user of a particular type of cutting tool.

Additionally, the serpentine cuts may also include other cuts that form non-linear edges. For example, the serpentine cuts can form rounded non-linear edges as shown, or it can be triangular (saw-toothed) cuts that result in saw-toothed edges, or any other types of cuts that go around the interconnects.

Figure 5B:
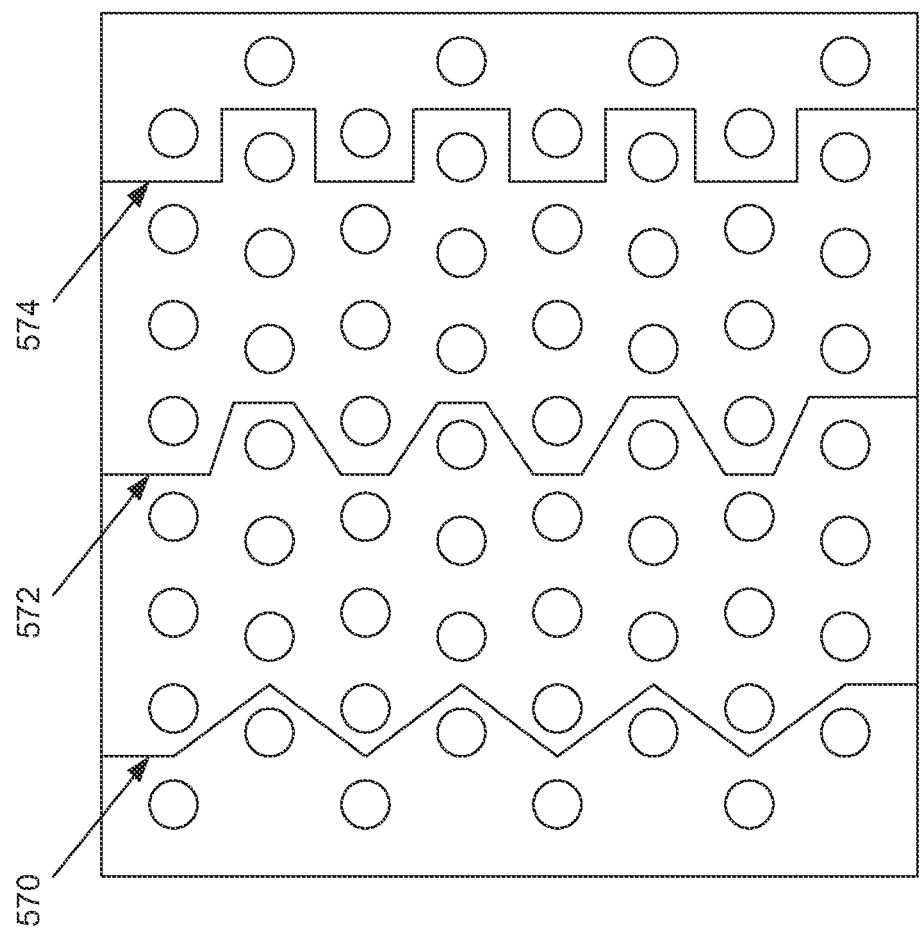
FIG. 5B illustrates examples of serpentine kerfs when dicing a die in accordance with an embodiment of the disclosure.

FIG. 5B illustrates examples of serpentine saw kerfs when sawing a die in accordance with an embodiment of the disclosure. Referring to FIG. 5B, there are shown examples of 3 different types of serpentine cuts around the edge interconnects that would result in different edges for dies. For example, the serpentine cut 570 shows triangular serpentine cuts around the edge interconnects, the serpentine cut 572 shows trapezoidal serpentine cuts around the edge interconnects, and the serpentine cut 574 shows square (rectangular) serpentine cuts around the edge interconnects. While not shown, a serpentine cut may comprise a mixture of different types of cuts. For example, a serpentine cut may comprise a mixture of the curved cuts of FIG. 5A and/or the various types of cuts shown in FIG. 5B. And although three different types of serpentine cuts are shown in FIG. 5B, various embodiments of the disclosure may comprise other types of serpentine cuts that do not result in a straight (linear) edge for a die.

FIG. 6 illustrates an interconnects at the edge of a die after reflow that can be used with an embodiment of the disclosure. The U.S. Pat. No. 7,659,621 filed on Feb. 27, 2006 is incorporated by reference into this disclosure as if fully set forth herein. Referring to FIG. 6, there are shown several views of a plated pattern 600 comprising solder reservoir 600a and an interconnect pattern 600b. There is a top view 602 of the plated pattern 600 at the edge of a saw street and a side view 604 of the plated pattern 600 at the edge of a saw street. After dicing from the wafer, the die is put through a solder reflow process where solder gathers on the interconnect pattern 600b to form a interconnect 600c as shown in top view 606 and side view 608. The solder reservoir 600a makes the interconnect 600c bigger than the interconnect pattern 600b so that the interconnect 600c overhangs the edge of the die. It has been shown by the Applicant that 90 μm interconnects can overhang the edge of the die by as much as 25 μm. The interconnect pattern 600b need not be circular under bump metallization (UBM) interconnects.

FIG. 7 illustrates interconnects at the edges of a die that can be used with an embodiment of the disclosure. Referring to FIG. 7, there are shown interconnects 702 formed on the edges of the die 700. The interconnects 702 are formed similarly as explained with respect to FIG. 6, and the interconnects 702 (e.g., edge pads or edge bumps) are added by taking advantage of die real estate that might not have been used otherwise.

Figure 8:
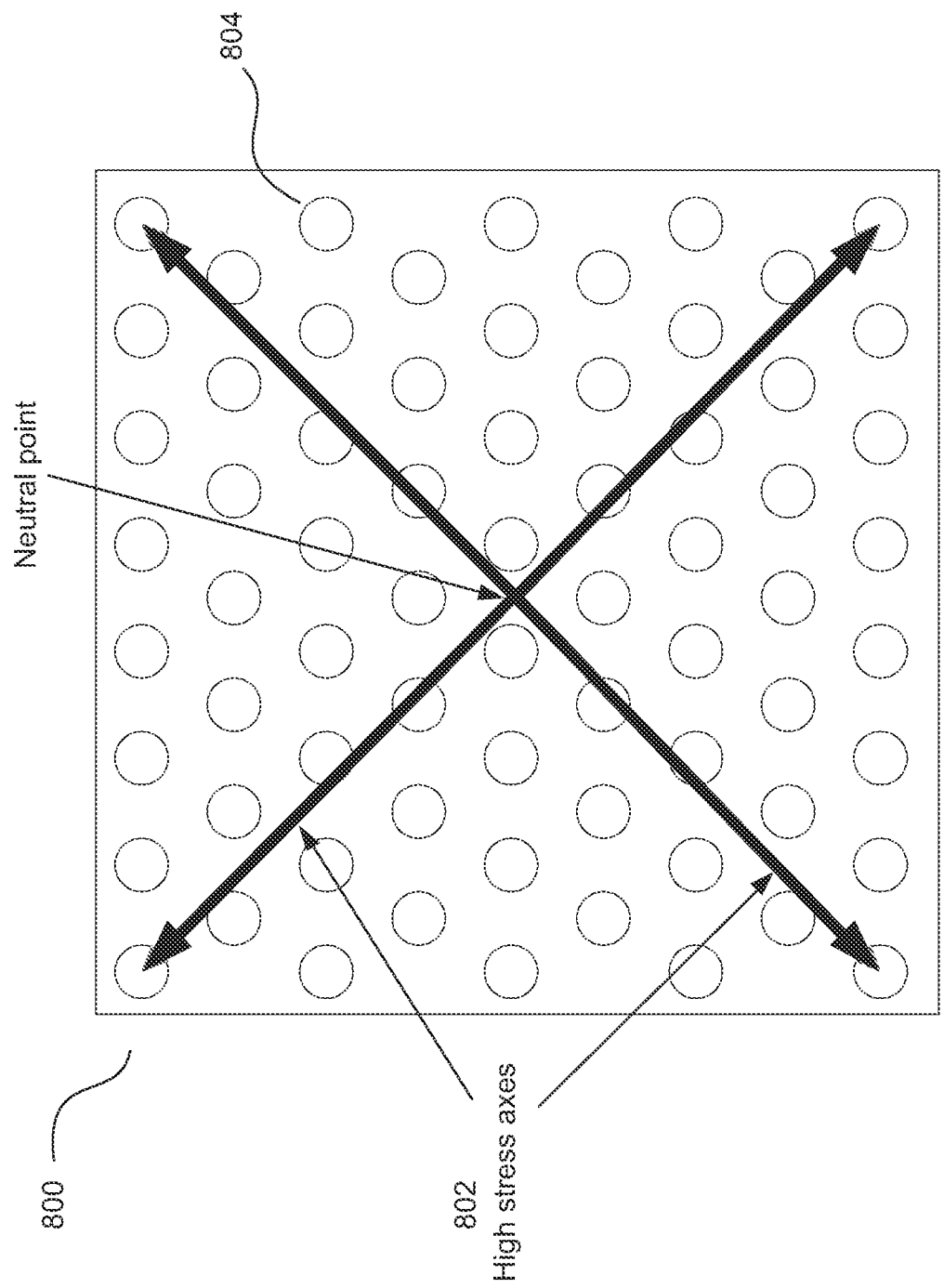
FIG. 8 illustrates examples of stress axes on a die.

FIG. 8 illustrates stress axes on a die. Referring to FIG. 8, there are shown two diagonal high-stress axes 802 on the die 800. While only these two axes are shown, it should be understood that a high-stress axis may generally radiate outward from the center of a die. An axis that radiates outward from a center of a die is also referred to as a radial axis. Therefore, when interconnects 804 are designed, care should be taken to endow them with enough mechanical strength to withstand the stress, especially along the high-stress axes 802, that may occur during the manufacturing process of a die and during packaging of the die 800. Additionally, the interconnects 804 should be able to carry sufficient input and output currents to and from the die 800. Accordingly, there may be a limit to how small an interconnect may be. However, an alternative may be to use two or more interconnects to carry current for the same signal or power transfer.

Figure 9A:
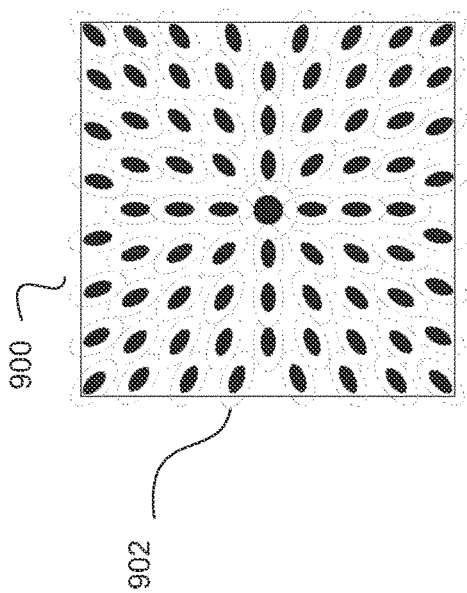
FIG. 9A illustrates an example of elliptical interconnects on a die in accordance with an embodiment of the disclosure.

FIG. 9A illustrates an example of elliptical interconnects on a die in accordance with an embodiment of the disclosure. Referring to FIG. 9A, there are shown interconnects 902 on a die 900 that are elliptically shaped. While these interconnects 902 are shown to be elongated in directions radiating from the center, various embodiments can have the interconnects 902 elongated in different directions. The elongated interconnects 902 can be said to have a major (long) axis and a minor (short) axis.

The alignment of the major axis in the die 900 may differ from region to region of the die 900. This may be due to specific needs of interconnects 902 in specific areas. For example, a major axis of an interconnect 902 may need to be aligned in a specific direction to maximize density in that area, or overall density for the die/substrate. This may depend on die/substrate size, substrate coefficient of thermal expansion, and/or temperature range of the application. The application can be the process of wafer fabrication, dicing dies from the wafer, placement of the dies on a substrate, dicing of the substrate, further packaging, wave soldering, reflow soldering, etc. The application can also be the environment that the die/substrate will be used in. Other criteria may also be evaluated as needed for shape and alignment of the interconnects 902 when different techniques or technologies are used for any of the above mentioned applications, or other applications.

In the example of 9A, it can be seen that the layout pattern used has the alignment of the major axis of the interconnects 902 substantially radial from a center of the die 900. However, other layout patterns can also be contemplated, and various embodiments of the disclosure are not limited to any specific layout pattern. Similarly, while the interconnects 902 are shown as ovals, the disclosure need not be so limited. Other non-circular shapes can be used for a non-circular interconnect. For example, the interconnects 902 may be rectangles with or without rounded corners, elongated polyhedron shape, egg shaped, arc shaped, etc.

While in some cases stress may be a part of the analysis in the alignment of the non-circular interconnects, the non-circular interconnects may be used when stress is not a factor for interconnect density optimization. For example, some dies may have lower stress but may need more interconnects than is possible with circular interconnects. Accordingly, the non-circular interconnects may be aligned in various directions, and according to many layout patterns, for various reasons.

Figure 9B:
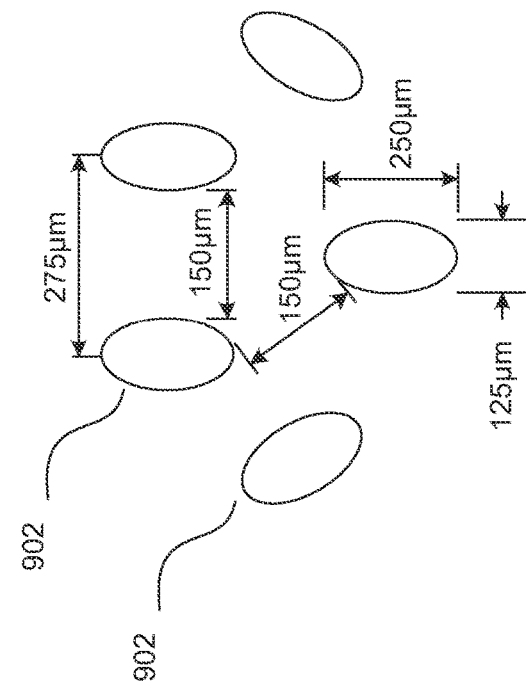
FIG. 9B illustrates an example of a pitch and space for elliptical interconnects in accordance with an embodiment of the disclosure.

FIG. 9B illustrates example of pitch and space for elliptical interconnects in accordance with an embodiment of the disclosure. In various embodiments of the disclosure, the interconnects 902 may be laid out to be 250 µm long (major axis) by 125 µm wide (minor axis) with the same space of 0.15 mm between the elliptical interconnects as for circular interconnects that have 0.4 mm pitch. However, the pitch along the minor axis for the elliptical interconnects 902 can be reduced by about 33% to 275 µm with respect to the pitch of 400 µm for the circular interconnects. The pitch in other directions can also be reduced, but not as much as along the minor axis. Accordingly, while the space between the interconnects may still be the same for design-rule or assembly purposes, the smaller pitch allows for greater interconnect density.

Various embodiments of the disclosure may have non-circular interconnects (e.g., bumps) that are not limited to the dimensions described. For example, rather than the length in the major elliptical axis being approximately the length of a standard interconnect (0.25 mm), it may be longer or shorter. And while the width in the minor elliptical axis is described as being substantially one-half of the length along the major elliptical axis, that width can also vary to be wider or narrower than one-half of the length along the major elliptical axis.

Figure 10A:
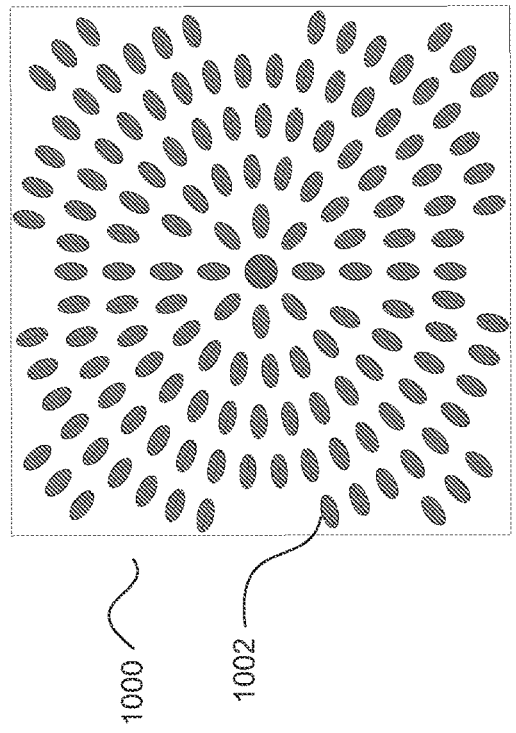
FIG. 10A illustrates example elliptical interconnects on a die in accordance with an embodiment of the disclosure.

FIG. 10A illustrates elliptical interconnects on a die in accordance with an embodiment of the disclosure. Referring to FIG. 10A, there is shown a die 1000 with elliptical interconnects 1002. By making the minor elliptical axis about one-half the length of the major elliptical axis and keeping the spacing substantially the same as the circular interconnects with 0.4 mm pitch, the interconnect density can be made to be greater than 1050 interconnects/cm$^2$. For comparison, as stated before, interconnect density for the circular interconnects at the standard 0.4 mm pitch and square grid packing is 576/cm$^2$. The spacing and/or the pitch for the elliptical interconnects 1002 can be varied as needed. Additionally, the elliptical interconnects 1002 can be laid out using polar coordinates rather than Cartesian coordinates. In addition to possibly increasing interconnect density, using polar coordinates may aid in routing to and from the interconnects 1002.

Figure 10B:
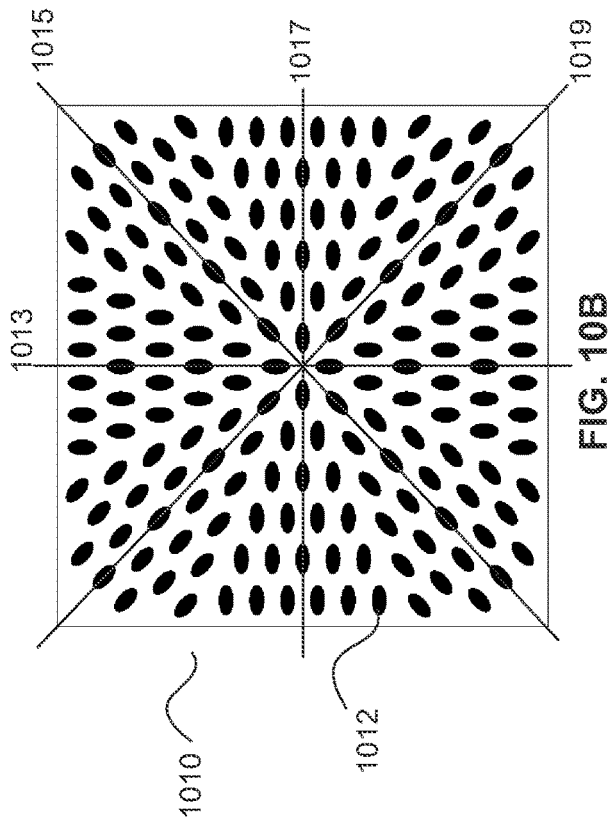
FIG. 10B illustrates example elliptical interconnects on a die in accordance with an embodiment of the disclosure.

FIG. 10B illustrates elliptical interconnects on a die in accordance with an embodiment of the disclosure. Referring to FIG. 10B, there is shown a die 1010 with elliptical interconnects 1012. As can be seen with FIGS. 10A and 10B, there are different ways to lay out the elliptical interconnects on a die. For example, as can be seen in FIG. 10B, not all of the rows of elliptical interconnects 1012 extend along or are aligned with the radial axes (e.g., 1013, 1015, 1017, 1019) of the die 1010. Some elliptical interconnects are aligned along a line parallel to a radial axis. Various layout patterns are available for the embodiments of the disclosure, and a specific layout of elliptical interconnects on a die may depend on various design considerations such as, for example, lines (axes) of stress, die/substrate size, substrate coefficient of thermal expansion, and/or temperature range of the application, etc.

Figure 10C:
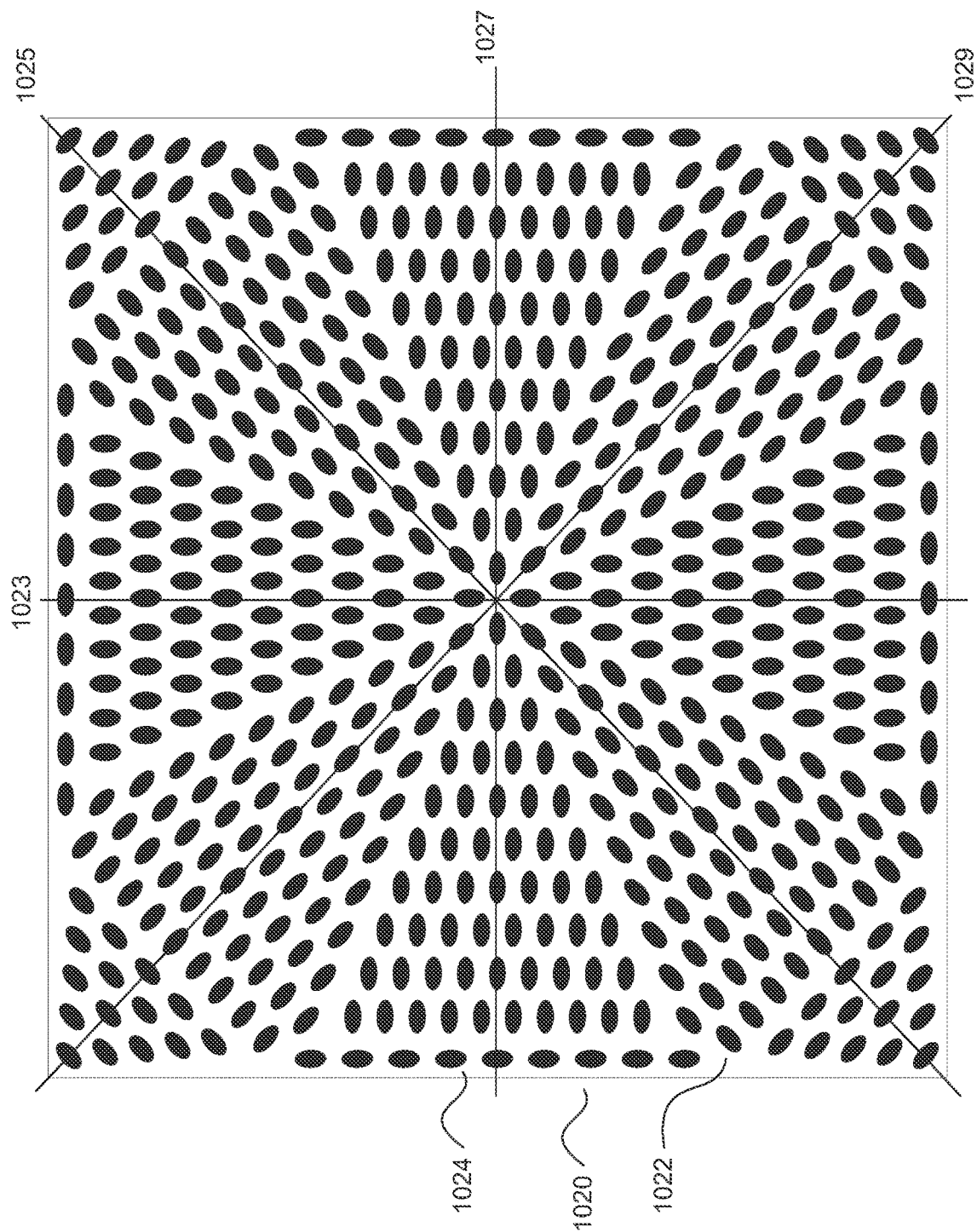
FIG. 10C illustrates example elliptical interconnects on a die in accordance with an embodiment of the disclosure.

FIG. 10C illustrates elliptical interconnects on a die in accordance with an embodiment of the disclosure. Referring to FIG. 10C, there is shown a die 1020 with elliptical interconnects 1022 and 1024. The elliptical interconnects 1022 are laid out similarly to the elliptical interconnects 1012 of FIG. 10B. However, the major axis of the elliptical interconnects 1024 is perpendicular to the major axis of the elliptical interconnects 1022. This may be for stress tolerance and/or interconnect density optimization, or other considerations previously mentioned. Accordingly, a die may have elliptical interconnects with their respective major axis aligned in different directions for a variety of reasons. Again, some radial axes (1023, 1025, 1027, 1029) are shown for the die 1020 for illustration. Various layout patterns are available for the embodiments of the disclosure, and a specific layout of elliptical interconnects on a die may depend on various design considerations such as, for example, lines (axes) of stress, die/substrate size, substrate coefficient of thermal expansion, and/or temperature range of the application, etc.

Figure 11:
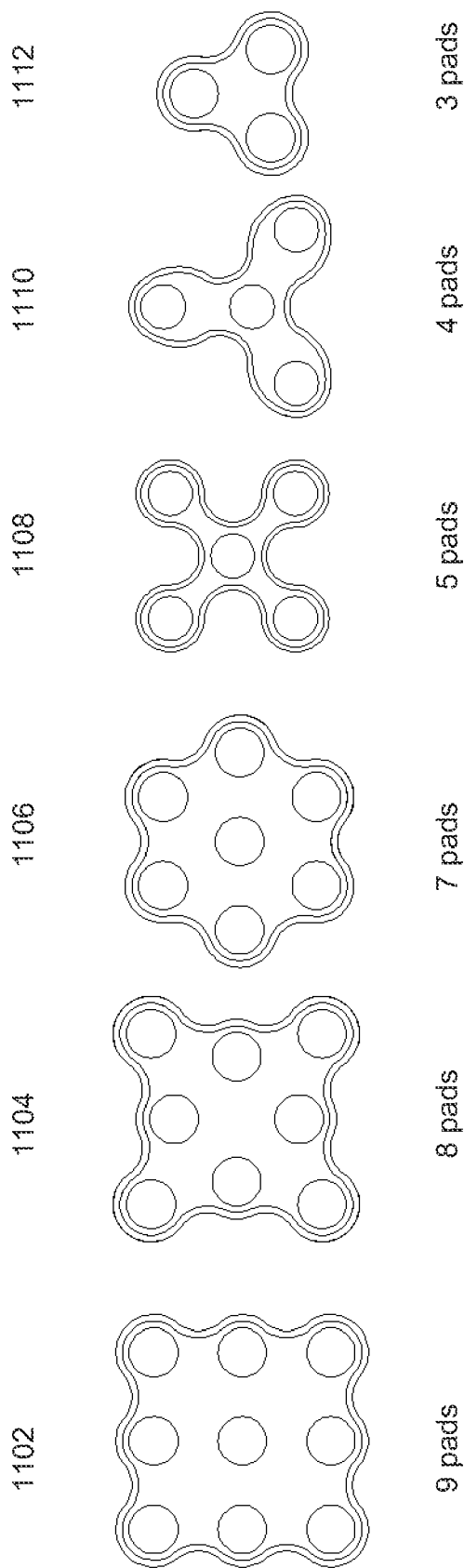
FIG. 11 illustrates various examples of die shapes and interconnect patterns for a die in accordance with an embodiment of the disclosure.

FIG. 11 illustrates various die shapes and interconnect patterns for a die in accordance with an embodiment of the disclosure. For dies with low interconnect count, different die shapes can be used to optimize the number of dies per wafer (DPW). However, it should be noted that dies with higher interconnect count may also use different die shapes to maximize the number of interconnects per die and/or the number of dies per wafer. Referring to FIG. 11, there are shown 6 die shapes that can be cut in a serpentine manner described above, with all interconnects (e.g., bumps) at 0.4 mm pitch. Die 1102 shows 9 interconnects in a square grid configuration with serpentine cuts around the interconnects at the perimeter of the die 1102. Die 1104 shows 8 interconnects in a square configuration with a row of 3 interconnects on top, a row of 2 interconnects in the middle, and a row of 3 interconnects on the bottom, with serpentine cuts around the perimeter of the die 1104.

Die 1106 shows a total of 7 interconnects in a hexagon configuration with 6 interconnects at the perimeter and an interconnect in the center, with serpentine cuts around the 6 interconnects at the perimeter of the die 1106. Die 1108 shows a total of 5 interconnects in an X configuration with 4 interconnects at the perimeter and an interconnect in the center, with serpentine cuts around the 4 perimeter interconnects. Die 1110 shows a 4 interconnect triangular configuration with 3 interconnects at the perimeter and an interconnect at the center. The serpentine cuts are around the 3 interconnects at the perimeter of the die 1110. Die 1112 shows a total of 3 interconnects in a triangular configuration, with serpentine cuts around the 3 interconnects.

While only six configurations have been shown in the interest of brevity, it should be understood that various embodiments can have different number of interconnects per die, and hence different geometric configurations. Additionally, there also may be different geometric configurations for a given number of interconnects. The geometric configurations may be regular or irregular.

Figure 12:
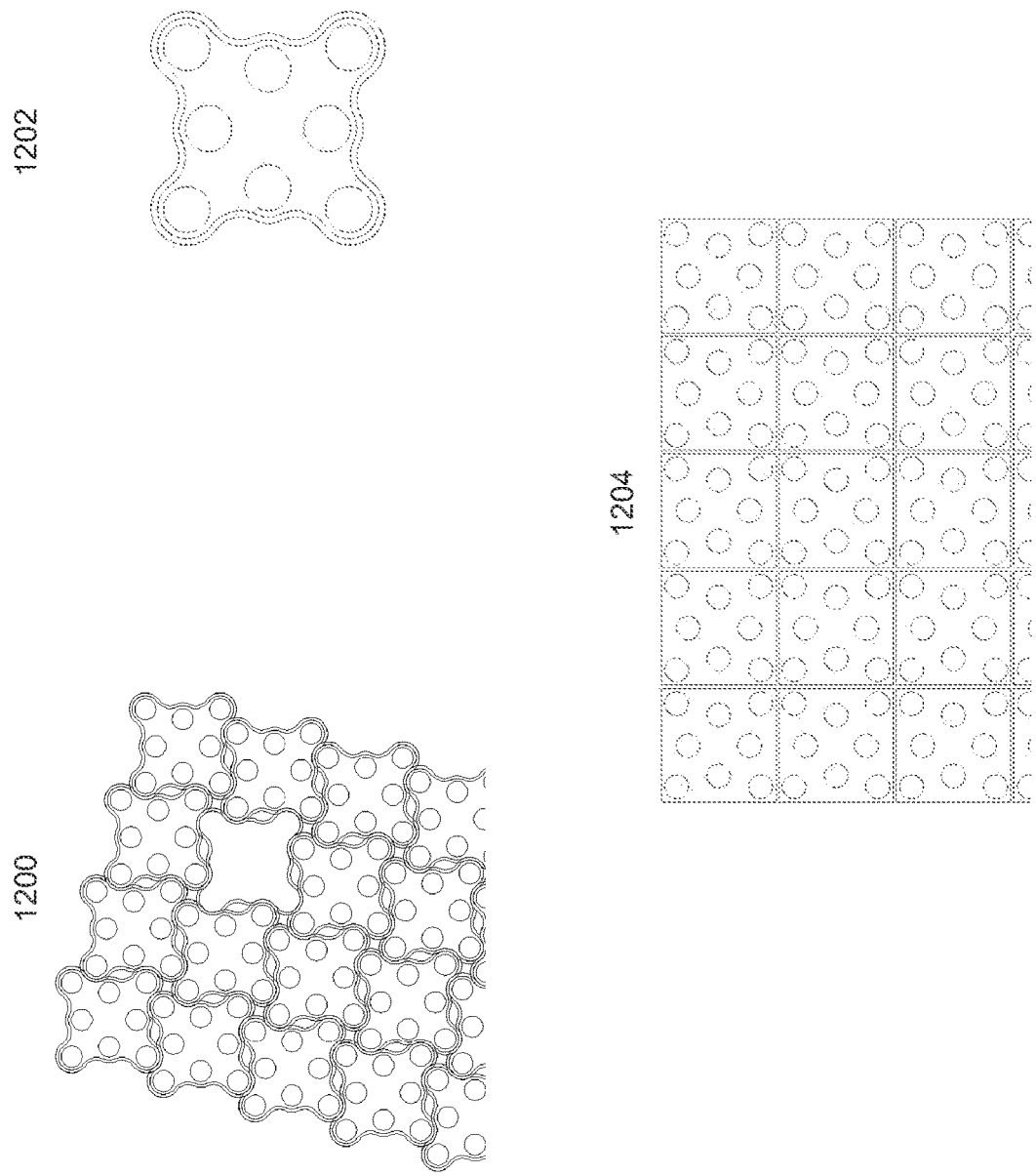
FIG. 12 illustrates an example of an eight-interconnect square die in accordance with an embodiment of the disclosure.

FIG. 12 illustrates an example of an eight-interconnect square shaped die in accordance with an embodiment of the disclosure. Referring to FIG. 12, there is shown the wafer 1200 with 8-interconnect square configuration dies that can be cut using serpentine cuts. It can be seen that the wafer 1200 has edge interconnects at a periphery of each die that fit in with edge interconnects at a periphery of an adjacent die. Accordingly, it might not be possible to draw a straight line between the edge interconnects at an edge of a first die and the edge interconnects at an adjacent edge of a second die. Also for example, a spacing (or pitch) between a column (or row) of a first die and an adjacent column (or row) of a second die may be less than a spacing (or pitch) between adjacent columns (or rows) of the first die. Die 1202 is an example of a die that can be diced from a wafer using serpentine cuts. Wafer 1204 is shown for comparison and is a wafer similar to the wafer 1200 except that the dies are cut using straight cuts.

The Applicant estimates that 32,124 dies can be fabricated on a 200 mm wafer if serpentine cuts are used to separate the dies. This is approximately a 21% increase over the number of 26,548 dies from the same wafer if straight cuts are used to separate the dies. The interconnect density with serpentine cuts is approximately 825 interconnects/cm$^2$ compared to about 681 interconnects/cm$^2$ when straight cuts are used to separate the dies.

Figure 13:
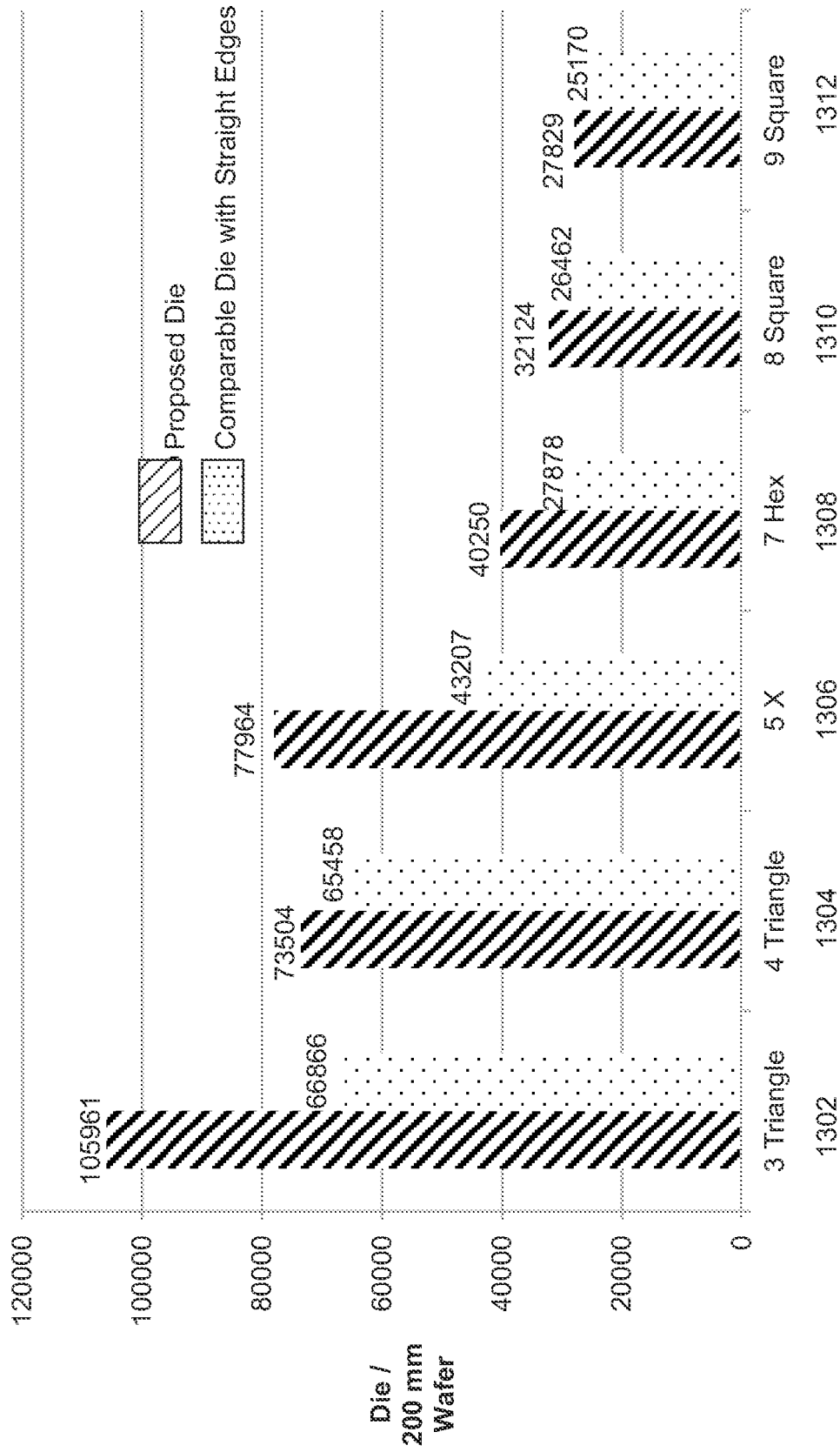
FIG. 13 is a graph comparing the number of dies of different shapes on a wafer in accordance with an embodiment of the disclosure.

FIG. 13 is a graph comparing the number of dies of different shapes on a wafer in accordance with an embodiment of the disclosure. Referring to FIG. 13, there is shown a graph for the 6 die configurations discussed with respect to FIG. 11. The diagonal stripes indicate estimated number of dies from a 200 mm wafer for each of the 6 die configurations with serpentine cuts and the dotted patterns indicate estimated number of dies from a 200 mm wafer for the same configurations with straight cuts.

As can be seen from 1302 for the 3-interconnect triangle configuration, the estimated number of dies is 105,961 with serpentine cuts and 66,866 with straight cuts. This is more than 58% increase in the number of dies by using serpentine cuts.

As can be seen from 1304 for the 4-interconnect triangle configuration, the estimated number of dies is 73,504 with serpentine cuts and 65,458 with straight cuts. This is more than 12% increase in the number of dies by using serpentine cuts.

As can be seen from 1306 for the 5-interconnects X configuration, the estimated number of dies is 77,964 with serpentine cuts and 43,207 with straight cuts. This is more than 80% increase in the number of dies by using serpentine cuts.

As can be seen from 1308 for the 7-interconnect hexagon configuration, the estimated number of dies is 40,250 with serpentine cuts and 27,878 with straight cuts. This is more than 44% increase in the number of dies by using serpentine cuts.

As can be seen from 1310 for the 8-interconnect square configuration, the estimated number of dies is 32,124 with serpentine cuts and 26,462 with straight cuts. This is more than 21% increase in the number of dies by using serpentine cuts.

As can be seen from 1312 for the 9-interconnect square configuration, the estimated number of dies is 27,829 with serpentine cuts and 25,170 with straight cuts. This is more than 10% increase in the number of dies by using serpentine cuts.

Accordingly, depending on the number of interconnects, there can be an increase of 10% to 80% in dies per 200 mm wafer.

Figure 14:
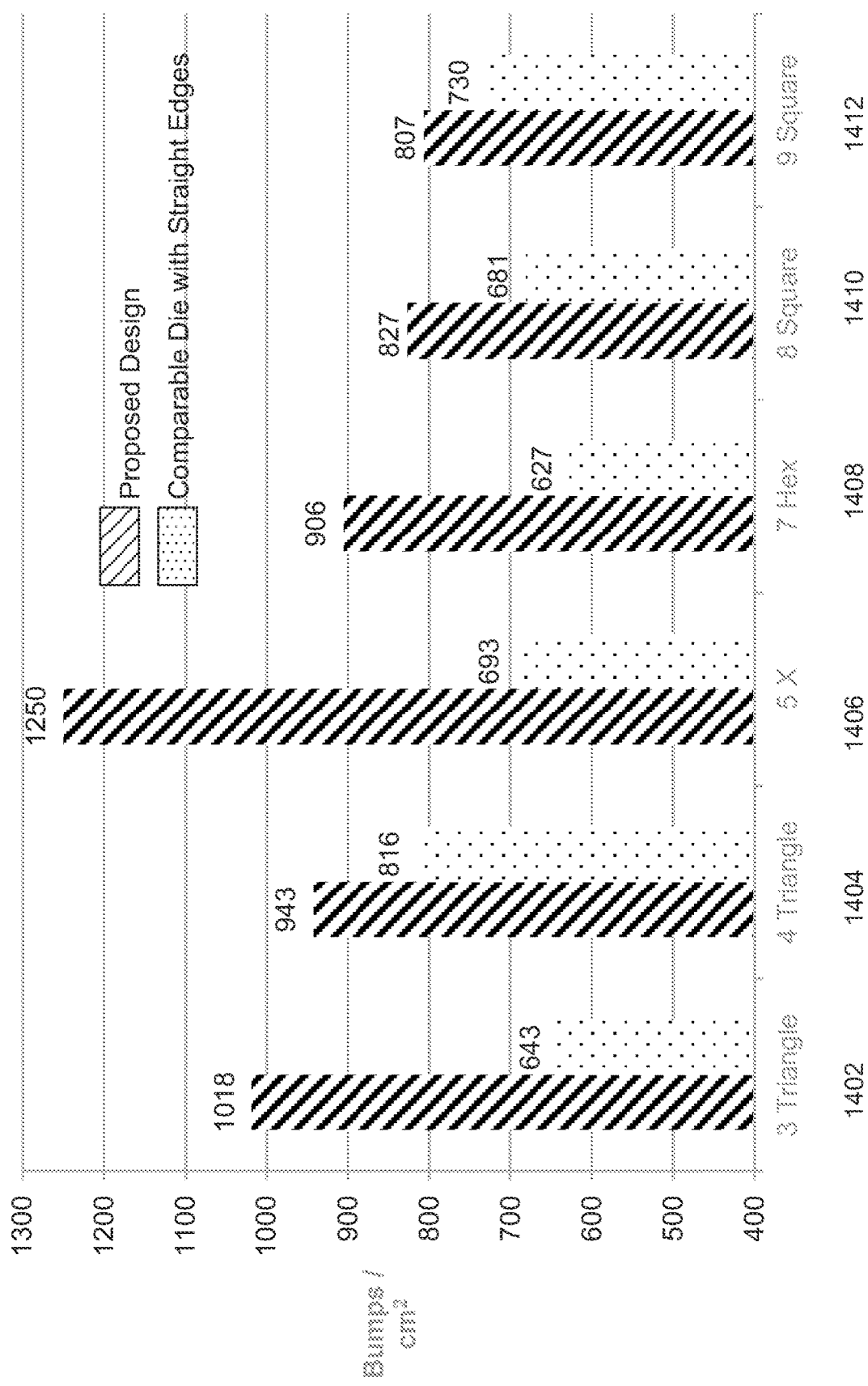
FIG. 14 is a graph comparing the density of interconnects on different shapes of dies in accordance with an embodiment of the disclosure.

FIG. 14 is a graph comparing the density of interconnects on different shapes of dies in accordance with an embodiment of the disclosure. Referring to FIG. 14, there is shown a graph for the 6 die configurations discussed with respect to FIG. 11. The diagonal stripes indicate estimated interconnect density for each of the 6 die configurations with serpentine cuts and the dotted pattern indicate estimated interconnect density for dies of the same configurations with straight cuts.

As can be seen from 1402 for the 3-interconnect triangle configuration, the estimated interconnect density is 1,018 interconnects/cm$^2$ with serpentine cuts and 643 interconnects/cm$^2$ with straight cuts. This is more than 58% increase in interconnect density by using serpentine cuts.

As can be seen from 1404 for the 4-interconnect triangle configuration, the estimated interconnect density is 943 interconnects/cm$^2$ with serpentine cuts and 816 interconnects/cm$^2$ with straight cuts. This is more than 15% increase in interconnect density by using serpentine cuts.

As can be seen from 1406 for the 5-interconnect X configuration, the estimated interconnect density is 1,250 interconnects/cm$^2$ with serpentine cuts and 693 interconnects/cm$^2$ with straight cuts. This is more than 80% increase in interconnect density by using serpentine cuts.

As can be seen from 1408 for the 7-interconnect hexagon configuration, the estimated interconnect density is 906 interconnects/cm$^2$ with serpentine cuts and 627 interconnects/cm$^2$ with straight cuts. This is more than 44% increase in interconnect density by using serpentine cuts.

As can be seen from 1410 for the 8-interconnect square configuration, the estimated interconnect density is 827 interconnects/cm$^2$ with serpentine cuts and 681 interconnects/cm$^2$ with straight cuts. This is more than 21% increase in interconnect density by using serpentine cuts.

As can be seen from 1412 for the 9-interconnect square configuration, the estimated interconnect density is 807 interconnect/cm$^2$ with serpentine cuts and 730 interconnect/cm$^2$ with straight cuts. This is more than 10% increase in interconnect density by using serpentine cuts.

Accordingly, depending on the number of interconnects, there can be an increase of from 10% to 80% in interconnect density for dies per wafer. The embodiments described so far can increase the interconnect density and/or dies per wafer.

As shown in FIGS. 13 and 14, while interconnect density increase may come from reduction in pitch of the interconnects, other factors may also come into play. These factors may be, for example, shape and layout of the die, street width, interconnect diameter, and interconnect to die edge spacing. Accordingly, while one equation may not be able to accurately describe different implementations, a very rough relationship is given by:

$$\% \text{ change in area} = ((1+\% \ CP)^2)-1 \qquad \text{Equation 1}$$

where % CP is % change in pitch. A decrease in pitch would be a negative value for % CP.

Figure 15B:
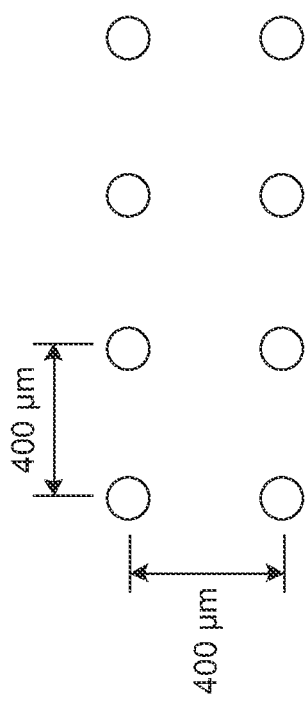
FIG. 15B is an illustration of interconnect pitch for a regular square grid configuration.
Figure 15C:
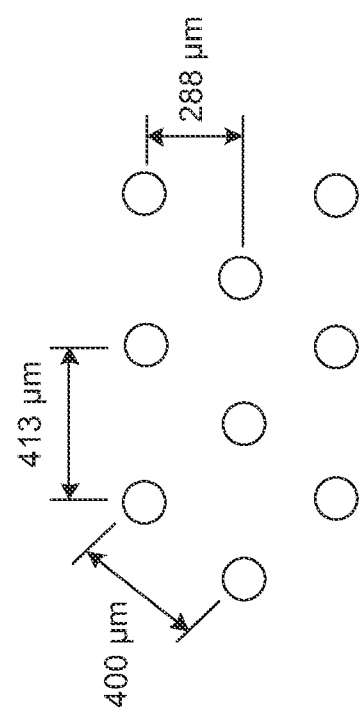
FIG. 15C is an illustration of an example interconnect pitch for a hexagonal grid configuration in accordance with an embodiment of the disclosure.
Figure 15A:
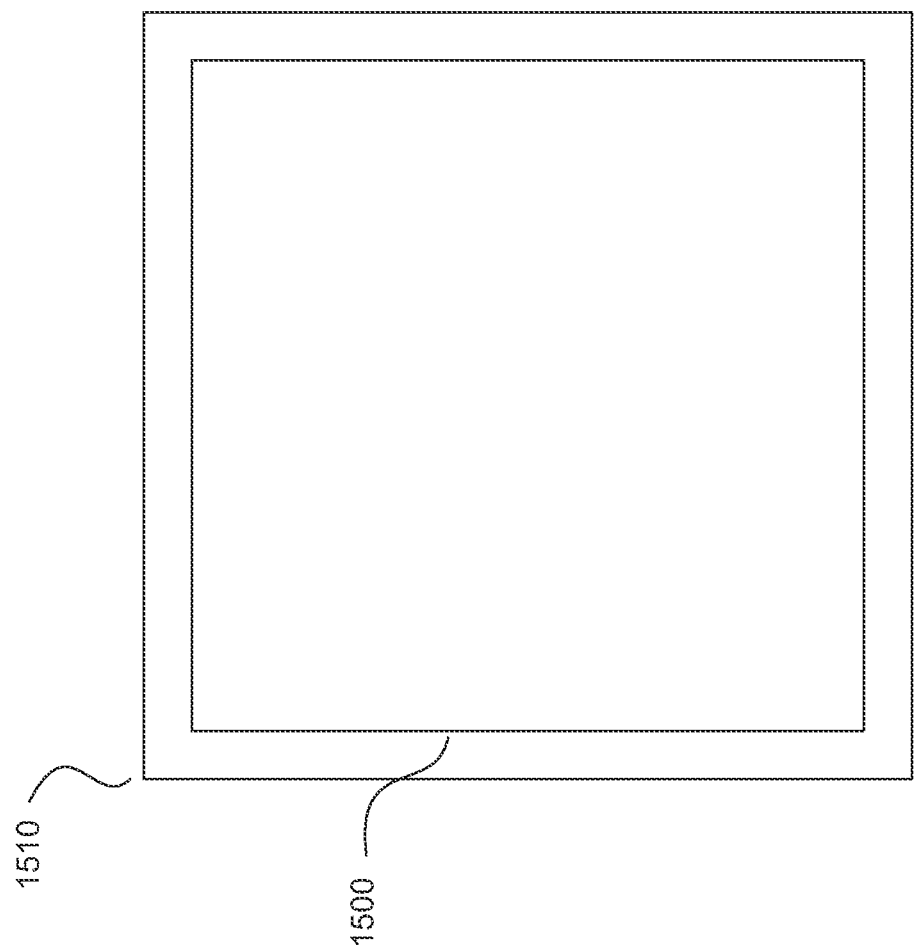
FIG. 15A is an illustration of wafer level fan out that may be used with an embodiment of the disclosure.

FIG. 15A is an illustration of wafer level fan out and FIG. 15B is an illustration of interconnect pitch for a regular square grid configuration. Referring to FIG. 15A, there is shown a 7 mm×7 mm die 1500 and an 8 mm×8 mm die 1510. While the die 1500 may be large enough for all circuitry, it might not be large enough for all the input/output interconnects needed for the circuitry. Accordingly, a larger die may be needed for extra interconnects. The die 1500 can typically fit a 17×17 grid of interconnects at 0.4 mm (400 µm) pitch, for a total of 289 interconnects. The separation among the interconnects is shown in FIG. 15B with 0.4 mm pitch horizontally and vertically among the interconnects. The larger die 1510 can typically fit a 19×19 grid of interconnects at 0.4 mm pitch for a total of 361 interconnects.

FIG. 15C is an illustration of interconnect pitch for an example of a hexagonal grid configuration in accordance with an embodiment of the disclosure. Referring to FIG. 15C, a modified hexagonal array of interconnects is shown where alternating rows of circular interconnects (e.g., bumps or pads) are offset, with a horizontal pitch for the interconnects of 413 µm and a diagonal pitch of 400 µm for the interconnects. However, because the vertical separation between adjacent rows is less than 300 µm, it is possible to have four additional rows for a layout of 17 columns by 21 rows, for a total of 357 interconnects.

Additionally, serpentine cutting may be used to pack the dies close together as described earlier. For example, a die may be within 80 µm of an adjacent die. The serpentine cuts may be made with plasma dicing, for example. The edge interconnects of adjacent dies may also be fit in with each other to help with the closer spacing.

Accordingly, almost the same number of interconnects (357 versus 361) can be made with a 7 mm×7 mm die 1510 as with an 8 mm×8 mm die 1520, where the smaller die 1510 is about 76% the size of the larger die 1520. And serpentine dicing reduces waste of usable die area by making the dicing street narrower than with straight cuts.

This description of a specific die is an example of an embodiment of the disclosure. Various other dies may have different horizontal pitch, vertical separation between rows, and/or diagonal pitch.

FIG. 16 is an illustration of an example of a 9-interconnect square die in accordance with an embodiment of the disclosure. Referring to FIG. 16, there is shown an example of a die layout 1600 on a wafer for a 9-interconnect square configuration, with a pull-out FIG. 1602 for a single die. An estimated 27,829 dies can be harvested from a 200 mm example of a with a interconnect density of 805 interconnects/cm$^2$. This is an 11% increase in dies per wafer with respect to a die layout 1604 with straight cuts. Part of this is due to the dies being laid out so that individual dies fit in with adjacent dies to reduce unused wafer material. It can be seen that the edge interconnects at the edges (or periphery) of each die fit in with edge interconnects at the edges (or periphery) of adjacent dies.

FIG. 17 is an illustration of an example of a 7-interconnect hex die in accordance with an embodiment of the disclosure. Referring to FIG. 17, there is shown an example of a die layout 1700 on a wafer for a 7-interconnect hexagon configuration, with a pull-out FIG. 1702 for a single die. An estimated 40,250 dies can be harvested from a 200 mm wafer with a interconnect density of 905 interconnect/cm$^2$. This is a 44% increase in dies per wafer with respect to a rectangular die layout 1704 with straight cuts and a 12% increase in dies per wafer with respect to a hexagonal die layout 1706 with straight cuts. Part of this is due to the individual dies fitting in with adjacent dies to reduce unused wafer material. It can be seen that the edge interconnects at the edges (or periphery) of each die fit in with edge interconnects at the edges (or periphery) of adjacent dies.

Figure 18:
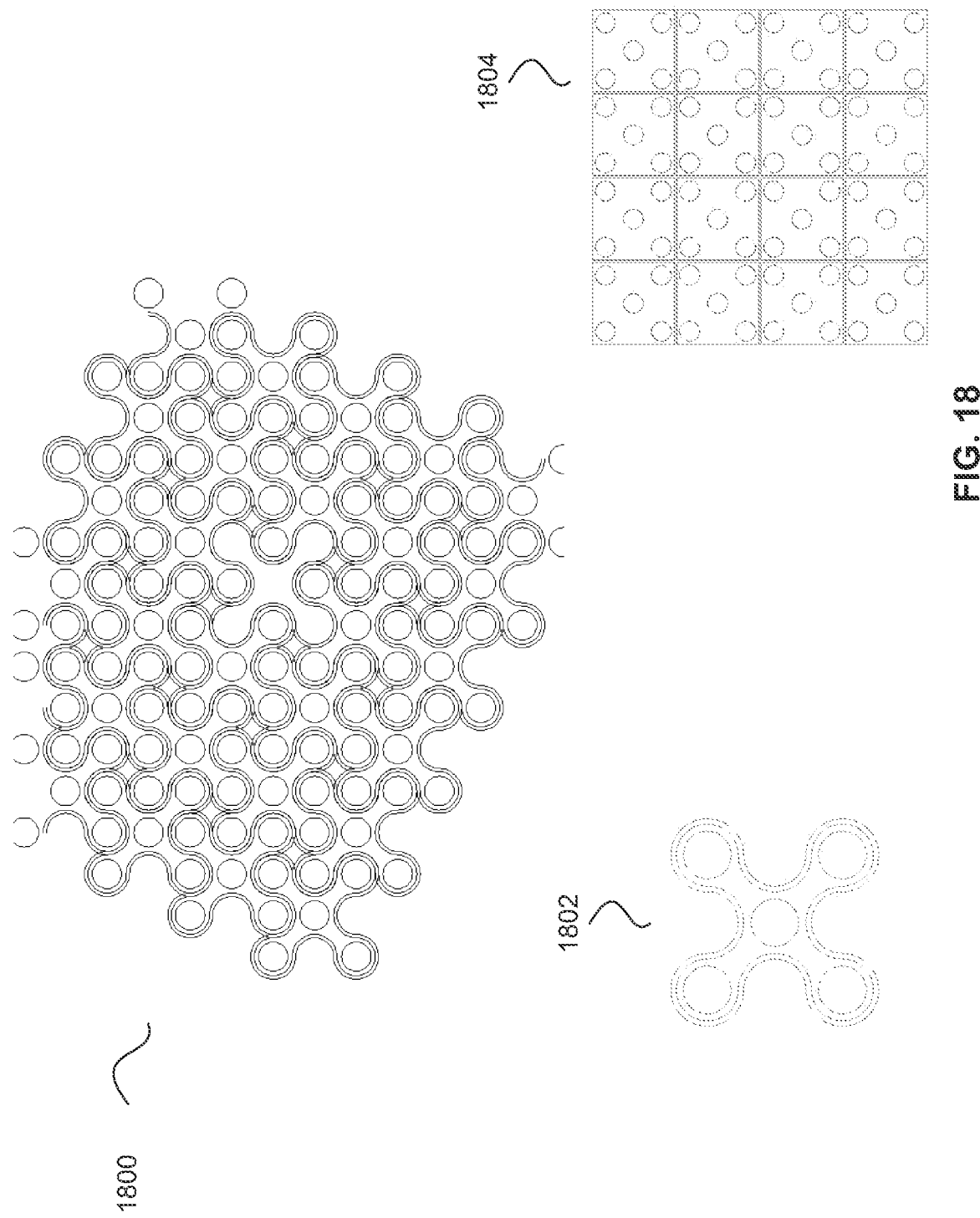
FIG. 18 is an illustration of an example of a 5-interconnect X die in accordance with an embodiment of the disclosure.

FIG. 18 is an illustration of an example of a 5-interconnect X die in accordance with an embodiment of the disclosure. Referring to FIG. 18, there is shown an example of a die layout 1800 on a wafer for a 5-interconnect X configuration, with a pull-out FIG. 1802 for a single die. An estimated 77,964 dies can be harvested from a 200 mm wafer with a interconnect density of 1250 interconnects/cm$^2$. This is an 80% increase in dies per wafer with respect to a die layout 1804 with straight cuts. Part of this is due to the individual dies fitting in with adjacent dies to reduce unused wafer material. It can be seen that the edge interconnects at the edges (or periphery) of each die fit in with edge interconnects at the edges (or periphery) of adjacent dies.

Figure 19:
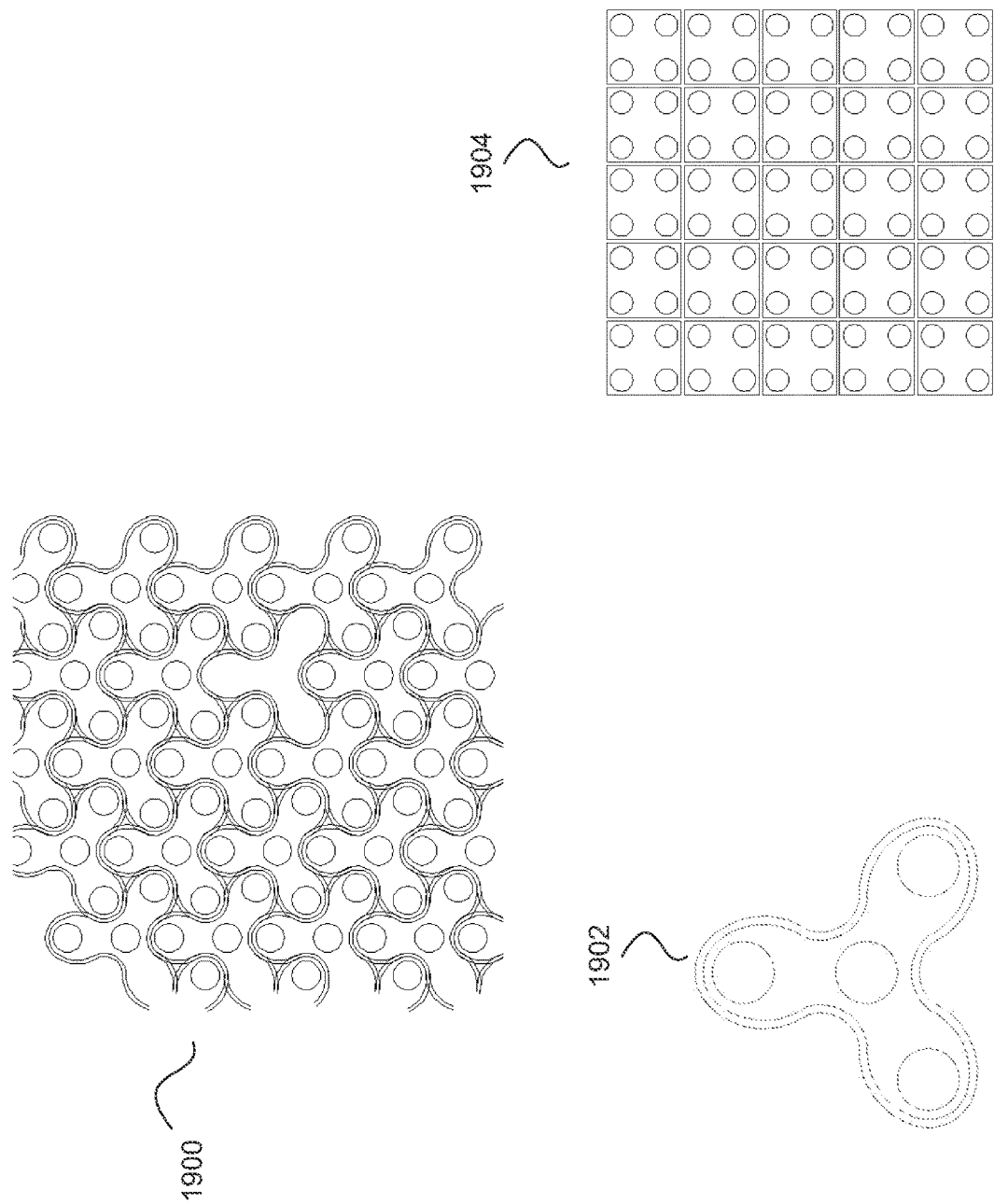
FIG. 19 is an illustration of an example of a 4-interconnect triangular die in accordance with an embodiment of the disclosure.

FIG. 19 is an illustration of an example of a 4-interconnect triangular die in accordance with an embodiment of the disclosure. Referring to FIG. 19, there is shown an example of a die layout 1900 on a wafer for a 4-interconnect triangular configuration, with a pull-out FIG. 1902 for a single die. An estimated 73,500 dies can be harvested from a 200 mm wafer with a interconnect density of 943 interconnects/cm$^2$. This is a 12% increase in dies per wafer with respect to a die layout 1904 with straight cuts. Part of this is due to the individual dies fitting in with adjacent dies to reduce unused wafer material. It can be seen that the edge interconnects at the edges (or periphery) of each die fit in with edge interconnects at the edges (or periphery) of adjacent dies.

Figure 20:
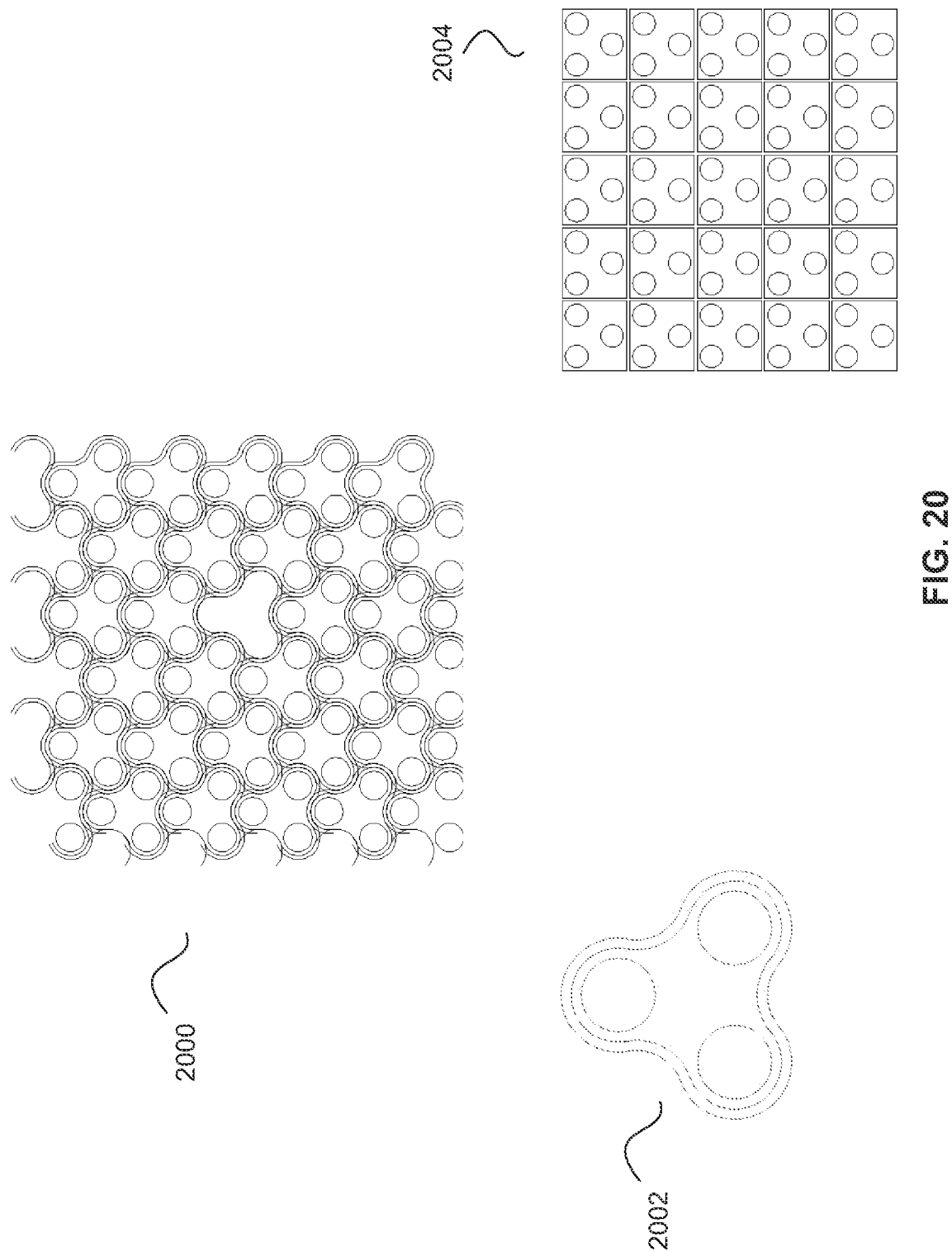
FIG. 20 is an illustration of an example of a 3-interconnect triangular die in accordance with an embodiment of the disclosure.

FIG. 20 is an illustration of an example of a 3-interconnect triangular die in accordance with an embodiment of the disclosure. Referring to FIG. 20, there is shown an example of a die layout 2000 on a wafer for a 3-interconnect triangular configuration, with a pull-out FIG. 2002 for a single die. An estimated 105,960 dies can be harvested from a 200 mm wafer with an interconnect density of 1018 interconnects/cm$^2$. This is a 58% increase in dies per wafer with respect to a die layout 2004 with straight cuts. Part of this is due to the individual dies fitting in with adjacent dies to reduce unused wafer material. It can be seen that the edge interconnects at the edges (or periphery) of each die fit in with edge interconnects at the edges (or periphery) of adjacent dies.

Accordingly, depending on the number of interconnects on a die, different die shapes can be used to optimize fitting in the die with its neighboring dies. While six different shapes have been shown with respect to six different numbers of interconnects on a die, various embodiments of the disclosure need not be so limited. Different die shapes can be used for different number of interconnects, and, generally, for a given number of interconnects there may be different die shapes that can be used.

Figure 21:
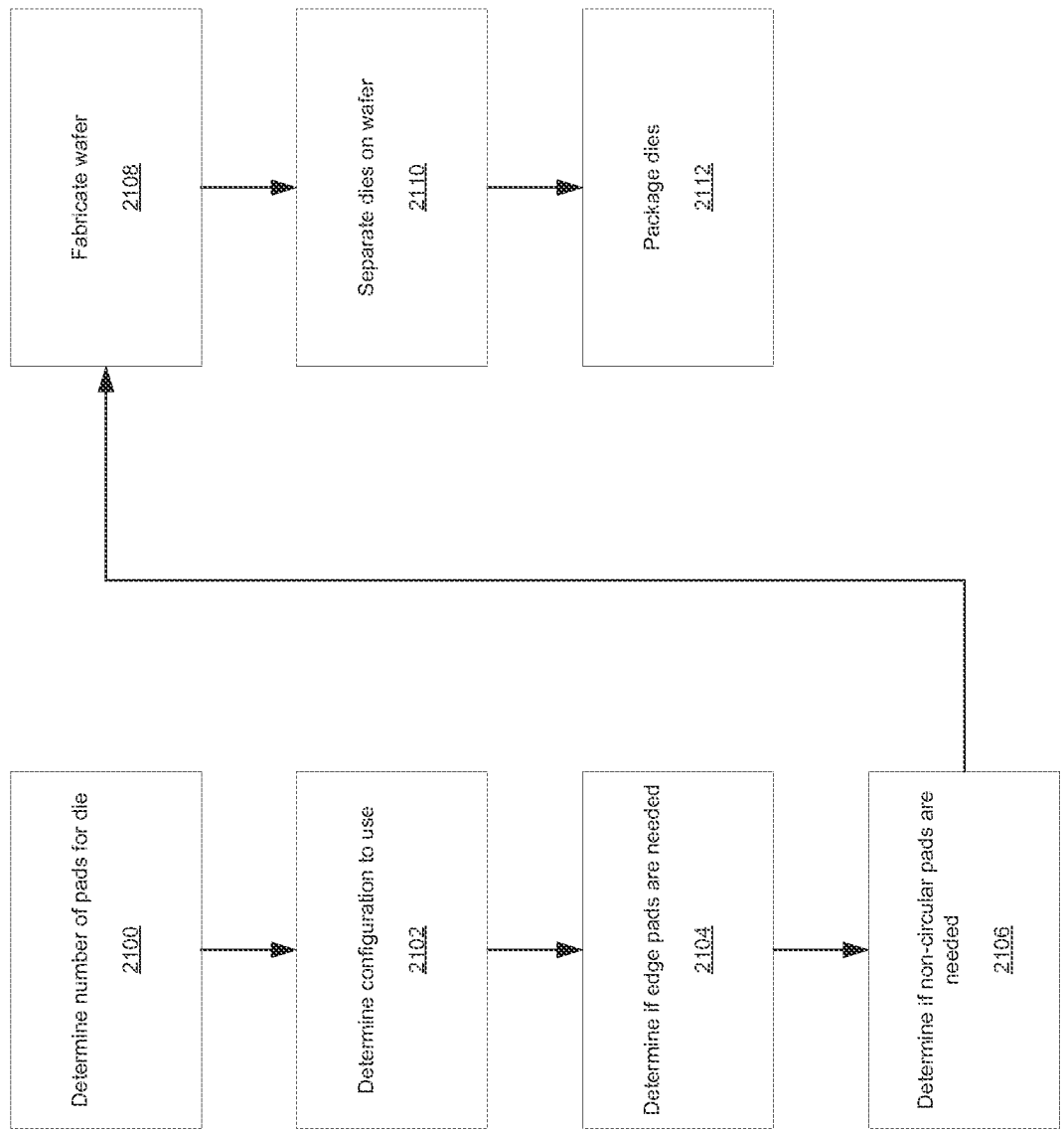
FIG. 21 is an example high-level flow diagram for fabricating dies in accordance with an embodiment of the disclosure.

FIG. 21 is an example of a high-level flow diagram for fabricating dies in accordance with an embodiment of the disclosure. Referring to FIG. 21, at 2100 a determination of input/output interconnects (e.g., bumps) is made. The number of interconnects may also include, for example, ground and power interconnects. At 2102, a size of the die is determined. The die size will take into account the total number of circular interconnects that can be placed on the die. At 2104, a determination is made as to whether edge interconnects are needed. This may be the case, for example, if a small number of extra interconnects are needed.

At 2106 a determination may be made as to whether non-circular interconnects are appropriate. It may be appropriate, for example, if the number of interconnects per die is still less than the desired number and the non-circular interconnects can handle the power requirements for the input/output signals. Additionally, various embodiments of the disclosure may lay out the interconnects such that certain interconnects with higher power requirements are circular and other interconnects that handle lower power are non-circular, or several non-circular interconnects are allotted to handle the power. Accordingly, a die may have one, two, or more different shapes for interconnects (e.g., bumps or pads), with appropriate pitch and space between the interconnects. The pitch and space between the interconnects may be different for different designs.

At 2108 the wafer is fabricated with the appropriate die size, circuit layout for the die, and interconnect selection and placement. The wafer may be laid out with non-linear edges for serpentine cuts, or with straight edges, depending on the level of die density optimization and technology available. At 2110 the fabricated wafer is separated to individual dies, and at 2112 the dies are packaged for use in circuit modules for electrical/electronic devices.

While an example of a flow diagram was described, various embodiments may use different algorithms for determining how to maximize the number of dies on a wafer. Also, while the flow diagram makes reference to a wafer and dies, as previously explained, the flow diagram may also refer to substrates upon which a number of dies are placed and electrically connected to the substrates, and then separated to individual substrates, or generally where a substrate needs to be separated to smaller parts.

Accordingly, various embodiments of the disclosure describe a substrate 500 comprising interconnects 501, where the interconnects 501 comprise edge interconnects 503 along edges of the substrate, and at least one of the edges 502 is non-linear. Additional embodiments also disclose a substrate 1000 comprising interconnects 1002, wherein a plurality of the interconnects 1002 are non-circular interconnects, and each non-circular interconnect has a major axis and a minor axis. Other embodiments disclose a substrate 120 comprising a first row of interconnects offset horizontally with respect to a second row of interconnects adjacent to the first row of interconnects, wherein adjacent interconnects of the first row of interconnects and adjacent interconnects of the second rows of interconnects have a first pitch 125, and the first pitch 125 is different than a vertical distance 127 from a line through centers of the first row of interconnects to a line through centers of the second row of interconnects.

Various embodiments of the disclosure may be written as computer programs and may be implemented in general-use digital computers that execute the programs using a non-transitory computer-readable recording medium.

Non-transitory computer-readable recording medium may include, for example, magnetic storage media (e.g., ROM, floppy disks, hard disks, etc.), optical recording media (e.g., CD-ROMs, or DVDs), etc.

While various embodiments of the disclosure have been described with reference to the figures, it will be understood by those of ordinary skill in the art that various changes in form and details may be made therein without departing from the spirit and scope of the disclosure as defined by the following claims. Accordingly, the above embodiments and all aspects thereof are examples only and are not limiting.

What is claimed:

1. An apparatus, comprising:
   a substrate having a first surface and a second surface opposite the first surface, wherein the second surface comprises at least eight regions bounded by first radial reference lines that radiate from a radial origin at the second surface and define an acute central angle of each region at the radial origin; and
   first interconnects arranged in each region, wherein each first interconnect includes a minor axis and a major axis greater than its respective minor axis, and wherein the major axis of each first interconnect in its respective region is parallel to a second radial reference line that radiates from the radial origin and through the respective region;
   wherein each of the first interconnects lies on the second radial reference line that radiates through its respective region;
   wherein each region includes second interconnects not lying on the second radial reference line that radiates through its respective region; and
   wherein a major axis of each second interconnect is parallel to the second radial reference line that radiates through its respective region.

2. The apparatus of claim 1, comprising third interconnects, wherein:
   the second surface of the substrate comprises a first perimeter edge;
   each third interconnect comprises a minor axis and a major axis greater than its respective minor axis; and
   each third interconnect is arranged along the first perimeter edge of the second surface such that the major axis of each third interconnect is parallel to the first perimeter edge of the second surface.

3. The apparatus of claim 1, comprising third interconnects, wherein:
   the second surface of the substrate comprises a perimeter edge with one or more corners;
   each third interconnect comprises a minor axis and a major axis greater than its respective minor axis; and
   each third interconnect is arranged along a first corner of the one or more corners such that the major axis of each third interconnect is perpendicular to a third radial reference line that radiates from the radial origin and through the first corner of the one or more corners.

4. The apparatus of claim 1, wherein:
   the substrate comprises a semiconductor die; and
   the first interconnects are connected to circuitry of the semiconductor die.

5. The apparatus of claim 1, comprising:
   a semiconductor die connected to the first surface of the substrate; and
   wherein the first interconnects are connected to circuitry of the semiconductor die via the substrate.

6. The apparatus of claim 1, wherein each first interconnect is elliptical.

7. The apparatus of claim 1, wherein each region is an isosceles wedge-shaped region.

8. The apparatus of claim 1, wherein every interconnect in a respective region comprises a major axis that is parallel to the second radial reference line radiating through the respective region.

9. The apparatus of claim 1, wherein each second radial reference line bisects the acute central angle of the region through which the respective second radial reference line radiates.

10. The apparatus of claim 1, wherein:
    each of the first interconnects lies on a first reference line that is parallel to the second radial reference line radiating through its respective region; and
    each region includes third interconnects that lie on a third reference line that is parallel to the second radial reference line radiating through its respective region; and
    a major axis of each third interconnect is parallel to the third reference line on which its respective third interconnect lies.

11. The apparatus of claim 1, wherein the acute central angles of the regions sum to 360°.

12. The apparatus of claim 1, wherein the major axis for each interconnect of the majority of the interconnects in each region is a same length.

13. The apparatus of claim 2, wherein:
    the substrate comprises a semiconductor die; and
    the first interconnects are connected to circuitry of the semiconductor die.

14. The apparatus of claim 2, wherein each interconnect is elliptical.

15. The apparatus of claim 2, wherein every interconnect in a respective region comprises a major axis that is parallel to the second radial reference line radiating through the respective region.

16. The apparatus of claim 2, wherein:
each of the first interconnects lies on a first reference line that is parallel to the second radial reference line radiating through its respective region; and
each region includes third interconnects that lie on a third reference line that is parallel to the second radial reference line radiating through its respective region; and
a major axis of each third interconnect is parallel to the third reference line on which its respective third interconnect lies.

17. The apparatus of claim 3, comprising:
a semiconductor die connected to the first surface of the substrate; and
wherein first interconnects are connected to circuitry of the semiconductor die via the substrate.

18. The apparatus of claim 3, wherein each second radial reference line bisects the acute central angle of the region through which the respective second radial reference line radiates.

19. A method comprising:
providing a substrate having a first surface and a second surface opposite the first surface; and
arranging interconnects on the second surface of the substrate such that the interconnects include at least one of:
first interconnects arranged in each first region of at least eight first regions of the second surface that are bounded by first radial reference lines radiating from a radial origin at the second surface and defining an acute central first angle of each first region at the radial origin, wherein each first interconnect includes a minor axis and a major axis greater than its respective minor axis, wherein the major axis of each first interconnect in its respective first region is parallel to a second radial reference line that radiates from the radial origin and through the respective first region, wherein each of the first interconnects lies on the second radial reference line that radiates through its respective region; wherein each region includes second interconnects not lying on the second radial reference line that radiates through its respective region, and wherein a major axis of each second interconnect is parallel to the second radial reference line that radiates through its respective region; or
second interconnects arranged in each second region of the second surface bounded by third radial reference lines that radiate from the radial origin at the second surface and define an acute central second angle of each second region at the radial origin, wherein the acute central second angles of the second regions sum to 360°, wherein each interconnect of a majority of the second interconnects includes a minor axis and a major axis greater than its respective minor axis, and wherein the major axis of each interconnect of the majority is parallel to a fourth radial reference line that radiates from the radial origin and through the respective second region.

* * * * *